United States Patent
Kimura et al.

(10) Patent No.: US 8,941,790 B2
(45) Date of Patent: Jan. 27, 2015

(54) LIQUID CRYSTAL DISPLAY DEVICE

(75) Inventors: Hajime Kimura, Kanagawa (JP); Atsushi Umezaki, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 438 days.

(21) Appl. No.: 13/110,403

(22) Filed: May 18, 2011

(65) Prior Publication Data
US 2011/0285930 A1  Nov. 24, 2011

(30) Foreign Application Priority Data

May 21, 2010  (JP) .................................. 2010-117300

(51) Int. Cl.
*H01L 27/12* (2006.01)
*G09G 3/36* (2006.01)

(52) U.S. Cl.
CPC .......... *H01L 27/1225* (2013.01); *G09G 3/3648* (2013.01); *G09G 2300/0426* (2013.01); *G09G 2300/0447* (2013.01); *G09G 2320/0214* (2013.01)
USPC .................................. 349/39; 349/38; 349/48

(58) Field of Classification Search
CPC ....................... G02F 1/136213; G02F 1/13624
USPC ................................. 349/38, 39, 48
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,597,348 | B1 | 7/2003 | Yamazaki et al. |
| 6,727,522 | B1 | 4/2004 | Kawasaki et al. |
| 7,049,190 | B2 | 5/2006 | Takeda et al. |
| 7,053,969 | B2 | 5/2006 | Yamazaki et al. |
| 7,061,014 | B2 | 6/2006 | Hosono et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Thanh-Nhan P Nguyen
(74) *Attorney, Agent, or Firm* — Fish & Richardson P.C.

(57) ABSTRACT

A semiconductor device or the like with low off-state current is provided. A semiconductor device or the like for displaying images accurately is provided. A display device or the like with a wide viewing angle is provided. A display device or the like in which image burn-in is suppressed is provided. In order to achieve any of the above objects, a circuit is formed using a transistor including an oxide semiconductor (OS), particularly a thin film MOS transistor including an oxide semiconductor. The oxide semiconductor is a substantially intrinsic semiconductor. Thus, the off-state current of the transistor is extremely low.

18 Claims, 27 Drawing Sheets

(56) References Cited

U.S. PATENT DOCUMENTS

| | | | |
|---|---|---|---|
| 7,064,346 B2 | 6/2006 | Kawasaki et al. |
| 7,105,868 B2 | 9/2006 | Nause et al. |
| 7,129,918 B2 | 10/2006 | Kimura |
| 7,145,536 B1 | 12/2006 | Yamazaki et al. |
| 7,211,825 B2 | 5/2007 | Shih et al |
| 7,212,265 B2 | 5/2007 | Eguchi et al |
| 7,282,782 B2 | 10/2007 | Hoffman et al. |
| 7,286,108 B2 | 10/2007 | Tsuda et al. |
| 7,297,977 B2 | 11/2007 | Hoffman et al. |
| 7,317,438 B2 | 1/2008 | Yamazaki et al. |
| 7,321,353 B2 | 1/2008 | Tsuda et al. |
| 7,323,356 B2 | 1/2008 | Hosono et al. |
| 7,385,224 B2 | 6/2008 | Ishii et al. |
| 7,385,579 B2 | 6/2008 | Satake |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,525,614 B2 | 4/2009 | Jeong et al. |
| 7,612,849 B2 | 11/2009 | Eguchi et al. |
| 7,674,650 B2 | 3/2010 | Akimoto et al. |
| 7,732,819 B2 | 6/2010 | Akimoto et al. |
| 7,738,055 B2 | 6/2010 | Egi et al. |
| 7,791,571 B2 | 9/2010 | Ohtani et al. |
| 7,821,613 B2 | 10/2010 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0046591 A1 | 3/2007 | Shishido et al. |
| 2007/0052025 A1 | 3/2007 | Yabuta |
| 2007/0054507 A1 | 3/2007 | Kaji et al. |
| 2007/0075627 A1 | 4/2007 | Kimura et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0279344 A1 | 12/2007 | Kimura et al. |
| 2007/0279374 A1 | 12/2007 | Kimura et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284929 A1 | 11/2008 | Kimura |
| 2008/0296568 A1 | 12/2008 | Ryu et al. |
| 2008/0297676 A1 | 12/2008 | Kimura |
| 2008/0308805 A1 | 12/2008 | Akimoto et al. |
| 2008/0308806 A1 | 12/2008 | Akimoto et al. |
| 2009/0002586 A1 | 1/2009 | Kimura |
| 2009/0008639 A1 | 1/2009 | Akimoto et al. |
| 2009/0009455 A1 | 1/2009 | Kimura |
| 2009/0011611 A1 | 1/2009 | Ichijo et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0289968 A1 | 11/2009 | Yoshida |
| 2009/0305461 A1* | 12/2009 | Akimoto et al. ............ 438/104 |
| 2010/0014012 A1* | 1/2010 | Irie et al. ............ 349/39 |
| 2010/0065844 A1 | 3/2010 | Tokunaga |
| 2010/0084651 A1 | 4/2010 | Yamazaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0149447 A1* | 6/2010 | Lee et al. ............ 349/39 |
| 2010/0155719 A1 | 6/2010 | Sakata et al. |
| 2011/0157216 A1 | 6/2011 | Yamazaki et al. |
| 2011/0157252 A1 | 6/2011 | Yamazaki et al. |
| 2011/0157253 A1 | 6/2011 | Yamazaki et al. |
| 2011/0157254 A1 | 6/2011 | Yamazaki et al. |
| 2011/0180794 A1 | 7/2011 | Yamazaki |
| 2011/0181560 A1 | 7/2011 | Yamazaki |
| 2011/0181806 A1 | 7/2011 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |

(56) References Cited

FOREIGN PATENT DOCUMENTS

| | | |
|---|---|---|
| JP | 2010-002898 A | 1/2010 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature dependence of characteristics and electronic structure for amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

(56) References Cited

OTHER PUBLICATIONS

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09: SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

LIQUID CRYSTAL DISPLAY DEVICE

BACKGROUND OF THE INVENTION

1. Field of the Invention

The present invention relates to semiconductor devices, display devices, liquid crystal display devices, light-emitting devices, manufacturing methods thereof, or driving methods thereof. In particular, the present invention relates to semiconductor devices, display devices, liquid crystal display devices, and light-emitting devices which include circuits including thin film transistors in which oxide semiconductors are used for semiconductor films, manufacturing methods thereof, or driving methods thereof.

2. Description of the Related Art

Currently, thin film transistors (TFTs) in which silicon layers formed using amorphous silicon or the like are used as channel layers are widely used as switching elements in display devices typified by liquid crystal display devices. Although thin film transistors formed using amorphous silicon have low field-effect mobility, they have an advantage that larger glass substrates can be used.

Further, in recent years, attention has been drawn to a technique by which a thin film transistor is formed using a metal oxide having semiconductor properties and such a transistor is used in an electronic device or an optical device. For example, it has been known that some metal oxides such as tungsten oxide, tin oxide, indium oxide, and zinc oxide have semiconductor properties. A thin film transistor in which a transparent semiconductor layer formed using such a metal oxide is used for a channel formation region has been disclosed (Reference 1).

REFERENCE

Reference 1: Japanese Published Patent Application No. 2006-165532

SUMMARY OF THE INVENTION

It is an object of one embodiment of the present invention to provide a semiconductor device or the like with low off-state current. It is an object of one embodiment of the present invention to provide a semiconductor device or the like with high withstand voltage. It is an object of one embodiment of the present invention to provide a semiconductor device or the like for displaying images accurately. It is an object of one embodiment of the present invention to provide a display device or the like with a wide viewing angle. It is an object of one embodiment of the present invention to provide a display device or the like in which image burn-in is suppressed. Note that the description of these objects does not impede the existence of other objects. Note that in one embodiment of the present invention, there is no need to achieve all the objects. Other objects will be apparent from and can be derived from the description of the specification, the drawings, the claims, and the like.

In order to achieve any of the above objects, a circuit is formed using a transistor including an oxide semiconductor (OS), particularly a thin film MOS transistor including an oxide semiconductor. The oxide semiconductor is a substantially intrinsic semiconductor. Thus, the off-state current of the transistor is extremely low or the withstand voltage of the transistor is high.

In one embodiment of the present invention, a liquid crystal display device which includes a pixel including a first transistor, a second transistor, a first liquid crystal element, and a second liquid crystal element is provided. A first terminal of the first transistor is electrically connected to a first wiring. A second terminal of the first transistor is electrically connected to the first liquid crystal element. A gate of the first transistor is electrically connected to a second wiring. A first terminal of the second transistor is electrically connected to the first wiring. A second terminal of the second transistor is electrically connected to the second liquid crystal element. A gate of the second transistor is electrically connected to a third wiring. The first transistor and the second transistor include an oxide semiconductor.

In one embodiment of the present invention, a liquid crystal display device which includes a pixel including a first transistor, a second transistor, a first liquid crystal element, and a second liquid crystal element is provided. A first terminal of the first transistor is electrically connected to a first wiring. A second terminal of the first transistor is electrically connected to the first liquid crystal element. A gate of the first transistor is electrically connected to a second wiring. A first terminal of the second transistor is electrically connected to a third wiring. A second terminal of the second transistor is electrically connected to the second liquid crystal element. A gate of the second transistor is electrically connected to the second wiring. The first transistor and the second transistor include an oxide semiconductor.

In one embodiment of the present invention, a liquid crystal display device which includes a pixel including a first transistor, a second transistor, a first liquid crystal element, and a second liquid crystal element is provided. A first terminal of the first transistor is electrically connected to a first wiring. A second terminal of the first transistor is electrically connected to the first liquid crystal element. A gate of the first transistor is electrically connected to a second wiring. A first terminal of the second transistor is electrically connected to the first wiring. A second terminal of the second transistor is electrically connected to the second liquid crystal element. A gate of the second transistor is electrically connected to the second wiring. The first transistor and the second transistor include an oxide semiconductor.

In one embodiment of the present invention, a liquid crystal display device which includes a pixel including a transistor, a first liquid crystal element, a second liquid crystal element, and a capacitor is provided. A first terminal of the transistor is electrically connected to a first wiring. A second terminal of the transistor is electrically connected to the first liquid crystal element. A gate of the transistor is electrically connected to a second wiring. A first terminal of the capacitor is electrically connected to the first liquid crystal element. A second terminal of the capacitor is electrically connected to the second liquid crystal element. The transistor includes an oxide semiconductor.

In one embodiment of the present invention, a liquid crystal display device which includes a pixel including a first transistor, a second transistor, a first liquid crystal element, a second liquid crystal element, and a capacitor is provided. A first terminal of the first transistor is electrically connected to a first wiring. A second terminal of the first transistor is electrically connected to the first liquid crystal element. A gate of the first transistor is electrically connected to a second wiring. A first terminal of the second transistor is electrically connected to the first wiring or the second terminal of the first transistor. A second terminal of the second transistor is electrically connected to the second liquid crystal element. A gate of the second transistor is electrically connected to the second wiring. A first terminal of the capacitor is electrically connected to the first liquid crystal element. A second terminal of the capacitor is electrically connected to the second liquid crystal element. The first transistor and the second transistor include an oxide semiconductor.

Note that in the drawings, the size, the thickness of layers, or regions are exaggerated for clarity in some cases. Thus, embodiments of the present invention are not limited to such scales.

Note that the drawings are schematic views showing ideal examples, and embodiments of the present invention are not limited to shapes or values shown in the drawings. For example, the following can be included: variation in shape due to a manufacturing technique or dimensional deviation; or variation in signal, voltage, or current due to noise or difference in timing.

Technical terms are used in order to describe a specific embodiment, example, or the like in many cases. Note that one embodiment of the invention is not construed as being limited by the technical terms.

Note that terms which are not defined (including terms used for science and technology, such as technical terms or academic parlance) can be used as terms which have meaning equal to general meaning that an ordinary person skilled in the art understands. It is preferable that terms defined by dictionaries or the like be construed as consistent meaning with the background of related art.

In the disclosed invention, for example, a circuit is formed using a transistor that includes an oxide semiconductor whose off-state current is low; thus, unnecessary current can be prevented from leaking in the circuit. Thus, images can be displayed accurately.

DETAILED DESCRIPTION OF THE INVENTION

Figure 1:
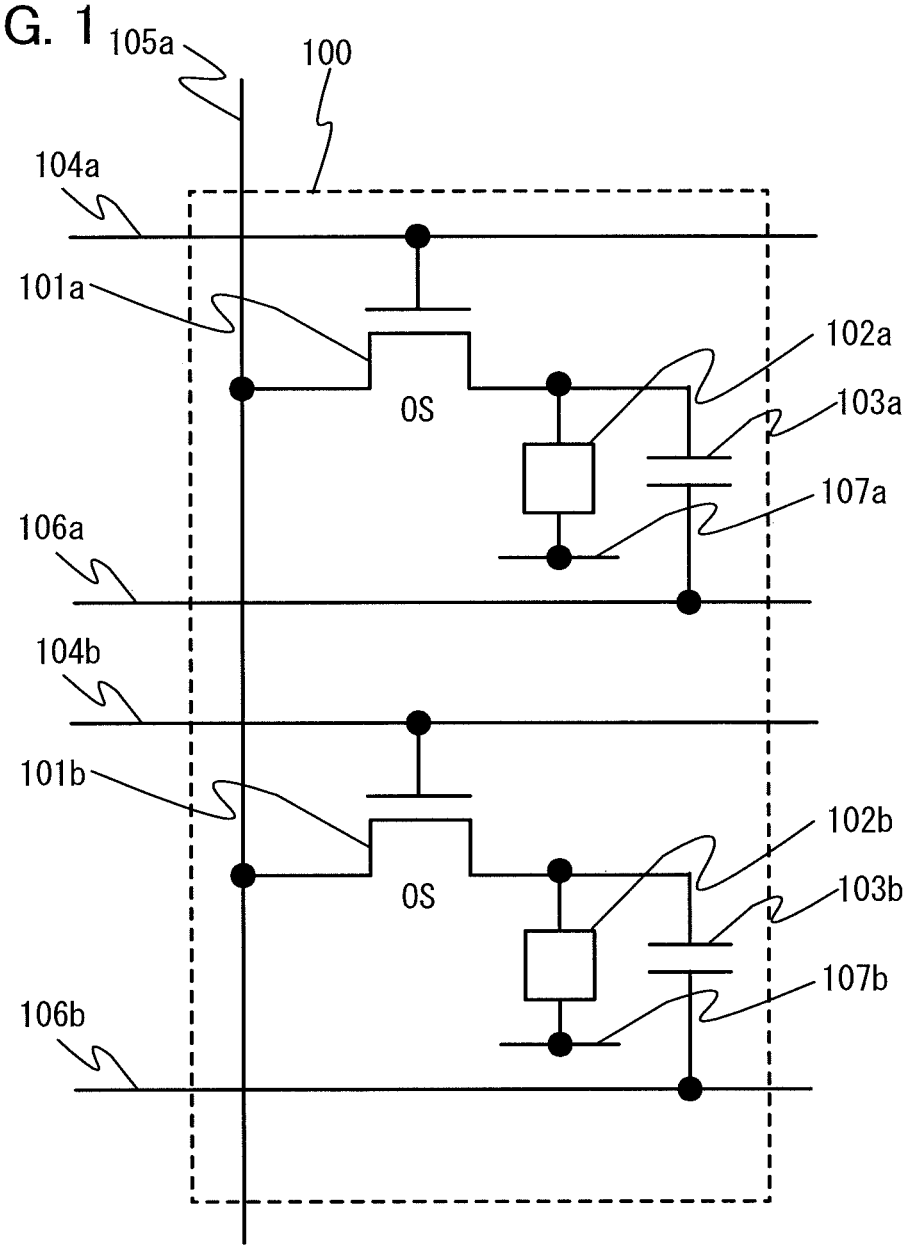
FIG. 1 is a circuit diagram illustrating a semiconductor device.

Embodiments will be described below with reference to the drawings. Note that the embodiments can be implemented in various different ways. It will be readily appreciated by those skilled in the art that modes and details of the embodiments can be modified in various ways without departing from the spirit and scope of the present invention. The present invention therefore should not be construed as being limited to the description of the embodiments. Note that in structures described below, the same portions or portions having similar functions are denoted by common reference numerals in different drawings, and detailed description thereof is not repeated.

Note that in this specification and the like, a transistor is an element having at least three terminals: a gate, a drain, and a source. The transistor has a channel region between the drain (a drain terminal, a drain region, or a drain electrode) and the source (a source terminal, a source region, or a source electrode) and current can flow through the drain, the channel region, and the source. Here, since the source and the drain of the transistor change depending on the structure, the operating condition, and the like of the transistor, it is difficult to define which is a source or a drain. Thus, a region which serves as a source or a region which serves as a drain is not referred to as a source or a drain in some cases. In that case, one of the source and the drain might be referred to as a first terminal, a first electrode, or a first region, and the other of the source and the drain might be referred to as a second terminal, a second electrode, or a second region, for example.

Note that in this specification and the like, terms such as "first", "second", and "third" are used for distinguishing various elements, members, regions, layers, and areas from others. The terms such as "first", "second", and "third" therefore do not limit the number of the elements, members, regions, layers, areas, or the like. Further, for example, the term "first" can be replaced with the term "second", "third", or the like.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted.

Note that in this specification and the like, a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted.

Note that in this specification and the like, a semiconductor device is a device which includes a circuit including a semiconductor element (e.g., a transistor, a diode, or a thyristor). The semiconductor device may correspond to all devices that can function by utilizing semiconductor characteristics and a device having a semiconductor material.

Note that a display device is a device having a display element. The display device may include a plurality of pixels each having a display element. Note that that the display device may include a peripheral driver circuit for driving the plurality of pixels. The peripheral driver circuit for driving the plurality of pixels may be formed using the same substrate as the plurality of pixels. The display device may include a peripheral driver circuit provided over a substrate by wire bonding or bump bonding, namely, an IC chip connected by chip on glass (COG) or an IC chip connected by TAB or the like. The display device may include a flexible printed circuit (FPC) to which an IC chip, a resistor, a capacitor, an inductor, a transistor, or the like is attached. Note that the display device may include a printed wiring board (PWB) which is connected through a flexible printed circuit (FPC) or the like and to which an IC chip, a resistor, a capacitor, an inductor, a transistor, or the like is attached. The display device may include an optical sheet such as a polarizing plate or a retardation plate. The display device may include a lighting device, a housing, an audio input-output device, an optical sensor, or the like.

Note that a lighting device may include a backlight unit, a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a light-emitting device is a device having a light-emitting element or the like. In the case where a light-emitting device includes a light-emitting element as a display element, the light-emitting device is one of specific examples of a display device.

Note that a reflective device is a device having a light-reflective element, a light diffraction element, a light-reflective electrode, or the like.

Note that a liquid crystal display device is a display device having a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device is a device having a semiconductor element, an electric circuit, or an electronic circuit. For example, a transistor which controls input of signals from a source signal line to pixels (also referred to as a selection transistor, a switching transistor, or the like), a transistor which supplies voltage or current to a pixel electrode, a transistor which supplies voltage or current to a light-emitting element, and the like are examples of the driving device. A circuit which supplies signals to a gate signal line (also referred to as a gate driver, a gate line driver circuit, or the like), a circuit which supplies signals to a source signal line (also referred to as a source driver, a source line driver circuit, or the like), and the like are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Embodiment 1

In this embodiment, an example of a semiconductor device or the like (e.g., a display device or a light-emitting device) which includes a transistor including an oxide semiconductor, particularly a thin film transistor including an oxide semiconductor in an active layer is described with reference to drawings. The off-state current of a transistor including an oxide semiconductor is low; thus, defects caused by off-state current can be reduced when a semiconductor device or the like including an oxide semiconductor is used. Thus, images can be displayed more accurately. Further, the transistor including an oxide semiconductor has high withstand voltage. Thus, even when high voltage is applied to the transistor, the transistor can operate normally and the off-state current of the transistor can be low. Consequently, defects caused by off-state current can be reduced.

A thin film transistor including an intrinsic (i-type) oxide semiconductor layer as an active layer is particularly preferable because the off-state current of the thin film transistor is low. As a method for making an oxide semiconductor layer intrinsic (i-type), dehydration or dehydrogenation is effective.

FIG. 1 illustrates a structure example of a semiconductor device or the like in this embodiment. In one aspect of this embodiment, a pixel 100 is provided. The pixel 100 constitutes one pixel.

Note that in this specification and the like, one pixel is one element whose brightness can be controlled. For example, one pixel is one color element and brightness is expressed with the one color element. Thus, in the case of a color display device having color elements of R (red), G (green), and B (blue), the minimum unit of an image includes three pixels: an R pixel, a G pixel, and a B pixel. Note that the color elements are not limited to three colors, and color elements of more than three colors may be used or a color other than R, G, and B may be used. For example, R, G, B, and W (W corresponds to white) can be used by addition of white. Alternatively, one or more colors of yellow, cyan, magenta, emerald green, vermilion, and the like can be added to R, G, and B, for example. Alternatively, a color which is similar to at least one of R, G, and B can be added to R, G and B. For example, R, B1, and B2 may be used. Although both B1 and B2 are blue, they have slightly different wavelengths. Similarly, R1, R2, G, and B can be used. By using such color elements, display which is closer to the real object can be performed and power consumption can be reduced.

Note that in the case where the brightness of one color element is controlled using a plurality of regions, one region can correspond to one pixel. For example, when area ratio gray scale display is performed or subpixels are included, a plurality of regions that control brightness are provided in each color element and gradation is expressed with the whole region in some cases. In that case, one region which controls brightness can correspond to one pixel. That is, one color element includes a plurality of pixels. Note that even when a plurality of regions that control brightness are provided in one color element, they may be collectively referred to as one pixel. In that case, one color element includes one pixel. Note that in the case where the brightness of one color element is controlled using a plurality of regions, regions which contribute to display might have different sizes depending on pixels. In the plurality of regions which control brightness in each color element, signals supplied to the plurality of regions may be slightly different from each other so that the viewing angle can be widened. In other words, the potentials of pixel electrodes in a plurality of regions in each color element may be different from each other. Accordingly, voltages applied to liquid crystal molecules are varied depending on the pixel electrodes. Thus, the viewing angle can be widened.

Note that explicit description "one pixel (for three colors)" corresponds to the case where three pixels of R, G, and B are considered as one pixel. Explicit description "one pixel (for one color)" corresponds to the case where a plurality of regions are provided in each color element and collectively considered as one pixel.

The pixel 100 includes a transistor 101a, a transistor 101b, a display element 102a, a display element 102b, a capacitor 103a, and a capacitor 103b. A gate of the transistor 101a is connected to a wiring 104a. A first terminal of the transistor 101a is connected to a wiring 105a. A second terminal of the transistor 101a is connected to a first terminal of the display element 102a. A second terminal of the display element 102a is connected to a wiring 107a. A first terminal of the capacitor 103a is connected to the first terminal of the display element 102a. A second terminal of the capacitor 103a is connected to a wiring 106a. A gate of the transistor 101b is connected to a wiring 104b. A first terminal of the transistor 101b is connected to the wiring 105a. A second terminal of the transistor 101b is connected to a first terminal of the display element 102b. A second terminal of the display element 102b is connected to a wiring 107b. A first terminal of the capacitor 103b is connected to the first terminal of the display element 102b. A second terminal of the capacitor 103b is connected to a wiring 106b.

Note that the transistor 101a or the transistor 101b has a function of selecting whether signals are supplied to the display element 102a (the capacitor 103a) or the display element 102b (the capacitor 103b). The transistor 101a or the transistor 101b therefore can function as a switch. Alternatively, the transistor 101a or the transistor 101b can function as a switching transistor, a switch transistor, or a selection transistor.

Note that in this specification and the like, for example, a transistor with a multi-gate structure having two or more gate electrodes can be used as a transistor. With the multi-gate structure, a structure where a plurality of transistors are connected in series is provided because channel regions are connected in series. Thus, with the multi-gate structure, off-state current can be reduced and the withstand voltage of the transistor can be increased (reliability can be improved). With the multi-gate structure, drain-source current does not fluctuate very much even when drain-source voltage fluctuates when the transistor operates in a saturation region, so that a flat slope of voltage-current characteristics can be obtained. By utilizing the flat slope of the voltage-current characteristics, an ideal current source circuit or an active load having an extremely large resistance value can be realized. Accordingly, a differential circuit, a current mirror circuit, or the like having excellent properties can be realized.

Note that for example, a transistor with a structure where gate electrodes are formed above and below a channel can be used as a transistor. With the structure where the gate electrodes are formed above and below the channel, a circuit structure where a plurality of transistors are connected in parallel is provided. Thus, a channel region is increased, so that the amount of current can be increased. With the structure where the gate electrodes are formed above and below the channel, a depletion layer can be easily formed, so that sub-threshold swing can be improved.

Note that for example, a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like can be used as a transistor.

Note that for example, a transistor with a structure where a source electrode or a drain electrode overlaps with a channel region (or part of it) can be used as a transistor. With the structure where the source electrode or the drain electrode overlaps with the channel region (or part of it), unstable operation due to accumulation of electrical charge in part of the channel region can be prevented.

Note that for example, a transistor with a structure where an LDD region is provided can be used as a transistor. By provision of the LDD region, off-state current can be reduced or the withstand voltage of the transistor can be increased (reliability can be improved). By provision of the LDD region, drain-source current does not fluctuate very much even when drain-source voltage fluctuates when the transistor operates in the saturation region, so that a flat slope of voltage-current characteristics can be obtained.

Note that here, the capacitor 103a or the capacitor 103b has a function of holding voltage supplied to the display element 102a or the display element 102b. Alternatively, the capacitor 103a or the capacitor 103b has a function of holding the potential of a pixel electrode of the display element 102a or the display element 102b. The capacitor 103a or the capacitor 103b therefore can function as a storage capacitor or an additional capacitor.

Here, wirings provided in a horizontal direction, such as the wirings 104a and 104b, are connected to gates of transistors included in pixels in some cases. Thus, the wirings provided in the horizontal direction, such as the wirings 104a and 104b, can function as gate signal lines, gate wirings, gate lines, or the like. Alternatively, the wirings provided in the horizontal direction, such as the wirings 104a and 104b, are supplied with signals for selecting rows one by one and the signals are scanned in some cases. Thus, the wirings provided in the horizontal direction, such as the wirings 104a and 104b, can function as scan signal lines, scan wirings, scan lines, or the like.

A wiring provided in a vertical direction, such as the wiring 105a, is connected to a source or a drain of a transistor included in a pixel in some cases. Thus, the wiring provided in the vertical direction, such as the wiring 105a, can function as a source signal line, a source wiring, a source line, or the like. Alternatively, the wiring provided in the vertical direction, such as the wiring 105a, is supplied with a data signal, a video signal, a source signal, or the like in some cases. Thus, the wiring provided in the vertical direction, such as the wiring 105a, can function as a data signal line, a data wiring, a data line, or the like.

Here, the wirings 107a and 107b can be connected to each other in all the pixels. Alternatively, the wirings 107a and 107b can be provided in a horizontal direction and can be connected to display elements included in pixels. Further, predetermined voltage is supplied to the wirings 107a and 107b. Alternatively, a signal is supplied to at least one row in some cases. Thus, the wirings 107a and 107b can function as common wirings, counter electrodes, or the like.

Here, the wirings 106a and 106b can be connected to other pixels, for example, right and left pixels. Further, predetermined voltage is supplied to the wirings 106a and 106b. Alternatively, a signal is supplied to at least one row in some cases. Thus, the wirings 106a and 106b can function as common wirings, capacitor wirings, or the like.

Note that in this specification and the like, a display element, a display device which is a device including a display element, a light-emitting element, and a light-emitting device which is a device including a light-emitting element can employ various modes and can include various elements. For example, a display medium whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light in accordance with current), an electron emitter, a liquid crystal element, electronic ink, an electrophoretic element, a grating light valve (GLV), a digital micromirror device (DMD), a piezoelectric ceramic display, or a carbon nanotube, can be used as a display element, a display device, a light-emitting element, or a light-emitting device. Display devices having EL elements include an EL display and the like. Display devices having electron emitters include a field emission display (FED), an SED-type flat panel display (SED: surface-conduction electron-emitter display), and the like. Display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Display devices having electronic ink or electrophoretic elements include electronic paper and the like.

Examples of an EL element are an element including an anode, a cathode, and an EL layer provided between the anode and the cathode, and the like. Examples of an EL layer are a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, a layer including a high-molecular material and a low-molecular material, and the like. Note that this embodiment is not limited to these, and a variety of EL elements can be used as an EL element.

Examples of an electron emitter are an element in which electrons are extracted by high electric field concentration on a cathode, and the like. Specifically, examples of an electron emitter are a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a thin film type in which a metal, an insulator, a semiconductor, and a metal are stacked, a HEED type, an EL type, a porous silicon type, a surface-conduction (SCE) type, and the like. Note that this embodiment is not limited to these, and a variety of elements can be used as an electron emitter.

For example, an element which controls transmission or non-transmission of light by optical modulation action of liquid crystals can be used as a liquid crystal element. The element can include a pair of electrodes and a liquid crystal layer. Note that the optical modulation action of liquid crystals is controlled by an electric field applied to the liquid crystals (including a horizontal electric field, a vertical electric field, and a diagonal electric field). Note that specifically, the following can be used for a liquid crystal element, for example: a nematic liquid crystal, a cholesteric liquid crystal, a smectic liquid crystal, a discotic liquid crystal, a thermotropic liquid crystal, a lyotropic liquid crystal, a low-molecular liquid crystal, a polymer liquid crystal, a polymer dispersed liquid crystal (PDLC), a ferroelectric liquid crystal, an anti-ferroelectric liquid crystal, a main-chain liquid crystal, a side-chain polymer liquid crystal, a plasma addressed liquid crystal (PALC), a banana-shaped liquid crystal, and the like. In addition, the following can be used as a driving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, PNLC (polymer network liquid crystal) mode, a guest-host mode, a blue phase mode, and the like. Note that this embodiment is not limited to these, and a variety of liquid crystal elements and driving methods thereof can be used as a liquid crystal element and a driving method thereof.

For example, display of electronic paper can be performed using molecules (a method using optical anisotropy, dye molecular orientation, or the like), particles (a method using electrophoresis, particle movement, particle rotation, phase change, or the like), movement of one end of a film, coloring properties or phase change of molecules, optical absorption by molecules, self-light emission by combination of electrons and holes, or the like. Specifically, examples of a display method of electronic paper are microcapsule electrophoresis, horizontal electrophoresis, vertical electrophoresis, a spherical twisting ball, a magnetic twisting ball, a columnar twisting ball, a charged toner, electronic liquid powder, magnetic electrophoresis, a magnetic thermosensitive type, electro wetting, light scattering (transparent-opaque change), a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, flexible organic EL, and the like. Note that this embodiment is not limited to these, and a variety of electronic paper and display methods thereof can be used as electronic paper and a driving method thereof. Here, with the use of microcapsule electrophoresis, aggregation and precipitation of phoresis particles can be prevented. Electronic liquid powder has advantages such as high-speed response, high reflectivity, a wide viewing angle, low power consumption, and memory properties.

Note that electroluminescence, a cold cathode fluorescent lamp, a hot cathode fluorescent lamp, an LED, a laser light source, a mercury lamp, or the like can be used as a light source of a display device in which a light source is needed, such as a liquid crystal display (e.g., a transmissive liquid crystal display, a transflective liquid crystal display, a reflective liquid crystal display, a direct-view liquid crystal display, or a projection liquid crystal display), a display device including a grating light valve (GLV), or a display device including a digital micromirror device (DMD), for example. Note that this embodiment is not limited to this, and a variety of light sources can be used as a light source.

Next, an example of the operation of the pixel 100 is described. Signals are supplied to the wirings 104a and 104b with timings shifted. For example, after a selection signal is supplied to the wiring 104a, a selection signal is supplied to the wiring 104b. Consequently, the transistor 101a or the transistor 101b is turned on. At this time, an image signal corresponding to the display element 102a and the display element 102b is supplied to the wiring 105a. Accordingly, voltages whose levels are different from each other can be supplied to the display element 102a and the display element 102b. Thus, the display element 102a and the display element 102b can be set to be in different states. For example, in the case where the display element 102a and the display element 102b include liquid crystal molecules, the alignment conditions of the liquid crystal molecules can be different from each other. When the alignment conditions of the liquid crystal molecules included in the display element 102a and the alignment conditions of the liquid crystal molecules included in the display element 102b are adjusted as appropriate in accordance with the brightness (gradation) of a display image, viewing angle characteristics can be improved.

Note that it is preferable that the area of the display element 102a be substantially equal to the area of the display element 102b. Note that one aspect of one embodiment of the present invention is not limited to this. The area of the display element 102a can be greatly different from the area of the display element 102b. For example, the ratio of the area of the display element 102a to the area of the display element 102b can be about 1 to 2. It is therefore possible to control the viewing angle characteristics adequately. Alternatively, an area ratio gray scale method can be used as one of multi-gradation methods.

Here, description "substantially equal" includes the case where a small difference such as a manufacturing error or a difference which does not substantially affect the operation exists. For example, the description "substantially equal" indicates the case where a difference between objects is less than 10%, preferably less than 5%.

Note that in the case where the area of the display element 102a is substantially equal to the area of the display element 102b, for example, the channel length or gate length of the transistor 101a is substantially equal to the channel length or gate length of the transistor 101b. As another example, the channel width or gate width of the transistor 101a is substantially equal to the channel width or gate width of the transistor 101b. As another example, the ratio of the channel width or gate width to the channel length or gate length of the transistor 101a is substantially equal to the ratio of the channel width or gate width to the channel length or gate length of the transistor 101b. Thus, signals can be supplied to display elements in a balanced manner; however, one aspect of one embodiment of the present invention is not limited to this.

Note that in the case where the area of the display element 102a is larger than the area of the display element 102b, for example, the channel length or gate length of the transistor 101a is shorter than the channel length or gate length of the transistor 101b. As another example, the channel width or gate width of the transistor 101a is larger than the channel width or gate width of the transistor 101b. As another example, the ratio of the channel width or gate width to the channel length or gate length of the transistor 101a is larger than the ratio of the channel width or gate width to the channel length or gate length of the transistor 101b. Thus, signals can be supplied to display elements in a balanced manner; however, one aspect of one embodiment of the present invention is not limited to this.

Since the pixel 100 includes the display element 102a and the display element 102b in this manner, it can be said that the pixel 100 includes two subpixels. In FIG. 1, it can be said that one subpixel includes the transistor 101a, the display element 102a, and the capacitor 103a and the other subpixel includes the transistor 101b, the display element 102b, and the capacitor 103b.

Note that although the pixel 100 illustrated in FIG. 1 includes two subpixels, one aspect of one embodiment of the present invention is not limited to this. The number of subpixels can be three or more.

Here, the transistor 101a and the transistor 101b can include an oxide semiconductor whose off-state current is low. Thus, even when the pixel 100 includes a plurality of subpixels and the capacitance value of the display element or the capacitor is decreased, voltage held by the display element or the capacitor can be prevented from being changed by the off-state current of the transistor.

Note that the pixel 100 illustrated in FIG. 1 performs control using the wirings 104a and 104b; thus, selection time per wiring is short. Thus, in order to input a signal quickly, the level of voltage applied to the gate of the transistor 101a and the gate of the transistor 101b is preferably high. Here, the transistor 101a and the transistor 101b can include an oxide semiconductor whose withstand voltage is high. Therefore, even when the level of voltage applied to the gate of the transistor 101a and the gate of the transistor 101b is high, a signal can be supplied quickly while the transistor is not damaged.

Figure 2:
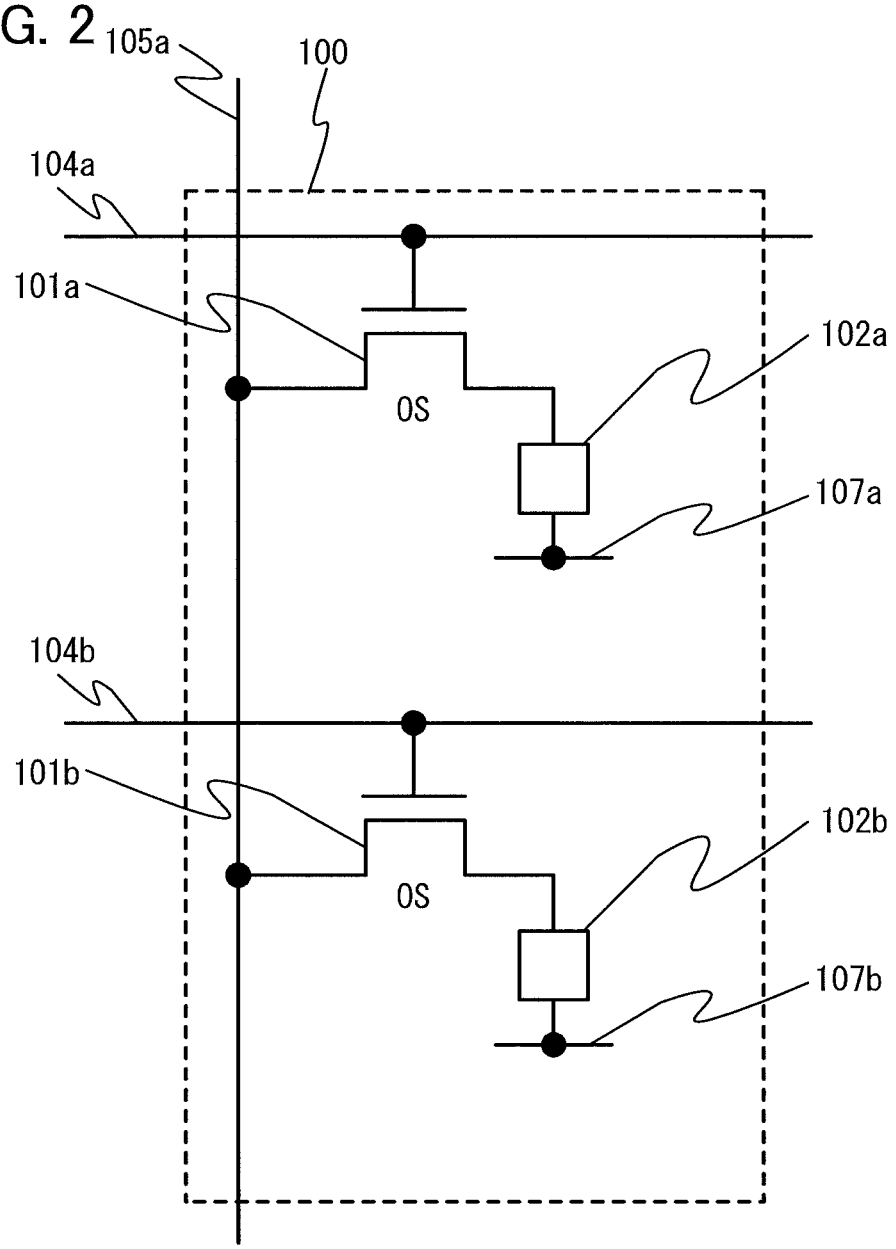
FIG. 2 is a circuit diagram illustrating a semiconductor device.

Note that it is possible not to provide at least one of the capacitor 103a and the capacitor 103b. FIG. 2 is a circuit diagram where the capacitor 103a and the capacitor 103b are not provided. In that case, with the use of a transistor whose off-state current is low, for example, a transistor including an oxide semiconductor as a transistor, voltage applied to the display element 102a and the display element 102b can be held without provision of the capacitor 103a and the capacitor 103b. Without provision of the capacitor 103a and the capacitor 103b, the aperture ratio can be improved.

Figure 3:
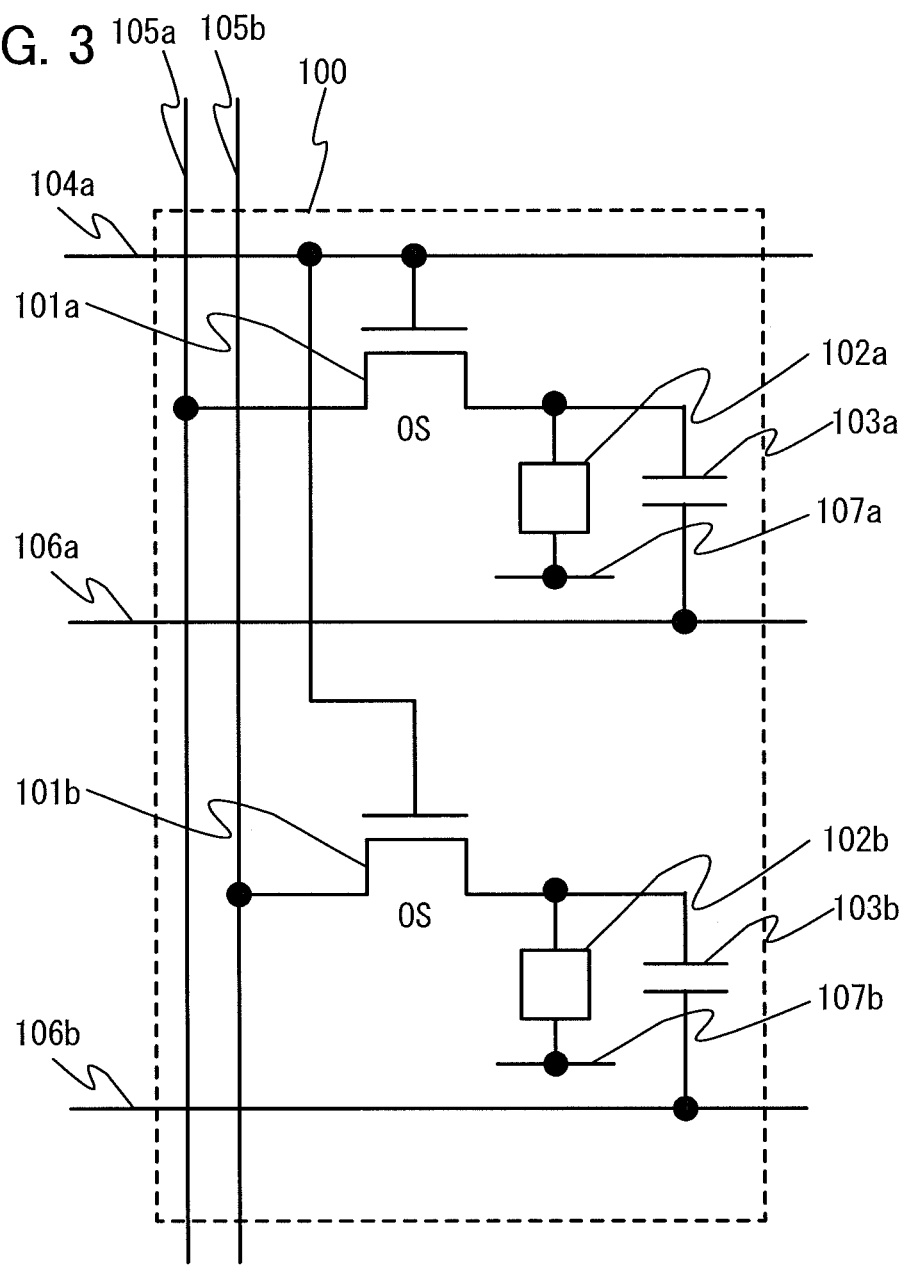
FIG. 3 is a circuit diagram illustrating a semiconductor device.

Note that pixel circuits including subpixels are not limited to those illustrated in FIG. 1 and FIG. 2. The pixel circuits can have a variety of different structures. FIG. 3 illustrates another example of the pixel circuit including subpixels.

In FIG. 3, the wiring 104b is not provided and a wiring 105b is added in the circuit in FIG. 1. The contents described with reference to FIG. 1 and FIG. 2 therefore can be applied to FIG. 3. In FIG. 3, the first terminal of the transistor 101b is connected to the wiring 105b, and the gate of the transistor 101b is connected to the wiring 104a. Except for these, FIG. 3 is similar to FIG. 1.

Here, wirings provided in a vertical direction, such as the wirings 105a and 105b, are connected to sources or drains of transistors included in pixels in some cases. Thus, the wirings provided in the vertical direction, such as the wirings 105a and 105b, can function as source signal lines, source wirings, source lines, or the like. Alternatively, the wirings provided in the vertical direction, such as the wirings 105a and 105b, are supplied with data signals, video signals, source signals, or the like in some cases. Thus, the wirings provided in the vertical direction, such as the wirings 105a and 105b, can function as data signal lines, data wirings, data lines, or the like.

Next, an example of the operation of the pixel 100 illustrated in FIG. 3 is described. First, a selection signal is supplied to the wiring 104a. Consequently, the transistor 101a and the transistor 101b are turned on. At this time, an image signal corresponding to the display element 102a is supplied to the wiring 105a, and an image signal corresponding to the display element 102b is supplied to the wiring 105b. Accordingly, voltages whose levels are different from each other can be supplied to the display element 102a and the display element 102b. Thus, the display element 102a and the display element 102b can be set to be in different states. For example, in the case where the display element 102a and the display element 102b include liquid crystal molecules, the alignment conditions of the liquid crystal molecules can be different from each other. Consequently, viewing angle characteristics can be improved.

Figure 4:
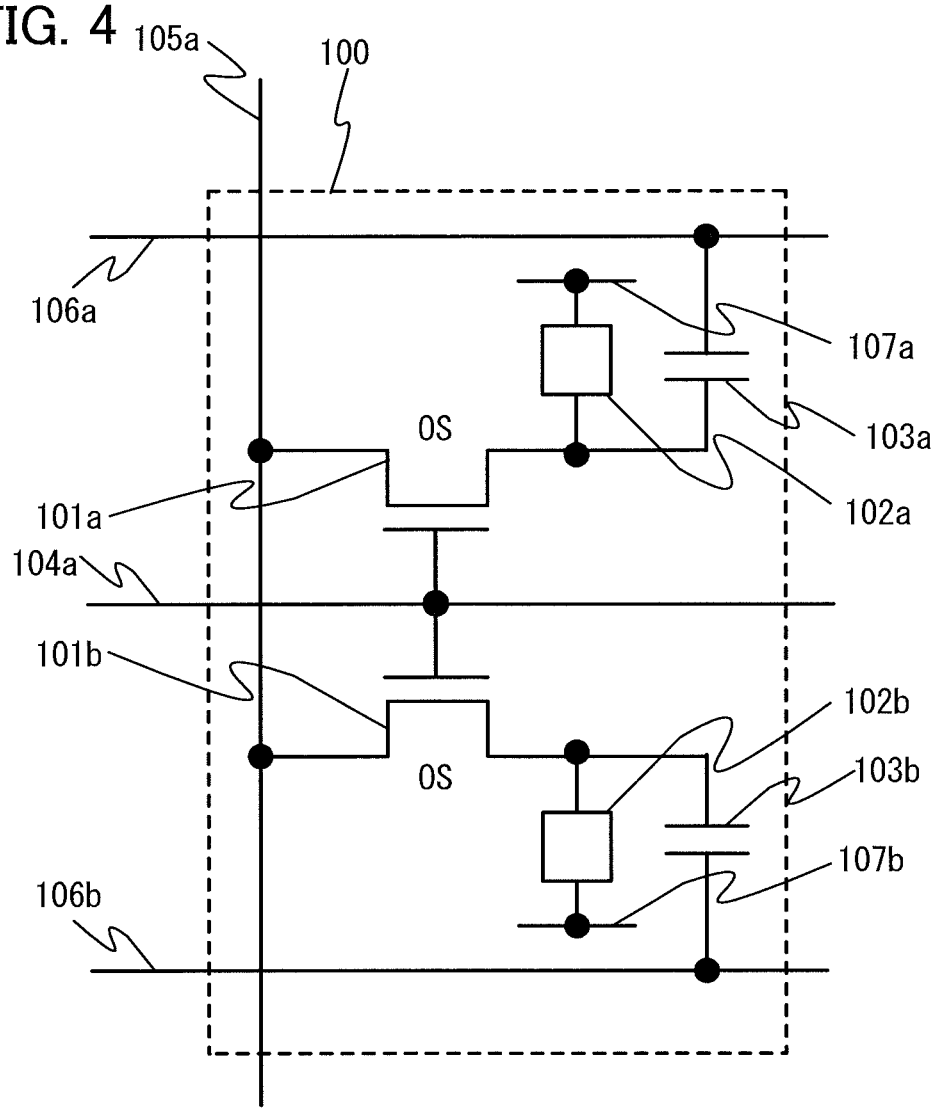
FIG. 4 is a circuit diagram illustrating a semiconductor device.

Next, FIG. 4 illustrates another example of the pixel circuit including subpixels.

In FIG. 4, the wiring 104b is not provided in the circuit in FIG. 1. In FIG. 4, the wiring 105b is not provided in the circuit in FIG. 3. The contents described with reference to FIG. 1, FIG. 2, and FIG. 3 therefore can be applied to FIG. 4. In FIG. 4, the first terminal of the transistor 101b is connected to the wiring 105a, and the gate of the transistor 101b is connected to the wiring 104a. Except for these, FIG. 4 is similar to FIG. 1 or FIG. 3.

Next, an example of the operation of the pixel 100 illustrated in FIG. 4 is described. First, a selection signal is supplied to the wiring 104a. Consequently, the transistor 101a and the transistor 101b are turned on. At this time, an image signal corresponding to the display element 102a and the display element 102b is supplied to the wiring 105a. Then, a non-selection signal is supplied to the wiring 104a. Consequently, the transistor 101a and the transistor 101b are turned off. After that, pulsed signals are supplied to the wiring 106a and the wiring 106b. The polarity (or level) of a signal supplied to the wiring 106a is made opposite to the polarity (or level) of a signal supplied to the wiring 106b. For example, while a high-potential signal is supplied to the wiring 106a, a low-potential signal is supplied to the wiring 106b. Alternatively, while a positive-potential signal is supplied to the wiring 106a, a negative-potential signal is supplied to the wiring 106b. The signals supplied to the wiring 106a and the wiring 106b are changed every predetermined period. For example, in a period, a positive-potential signal is supplied to the wiring 106a and a negative-potential signal is supplied to the wiring 106b; in the next period, a negative-potential signal is supplied to the wiring 106a and a positive-potential signal is supplied to the wiring 106b; such operations are repeated. Accordingly, averaged voltages are applied to the display element 102a and the display element 102b; thus, voltages whose levels are different from each other can be supplied to the display element 102a and the display element 102b. Thus, the display element 102a and the display element 102b can be set to be in different states. For example, in the case where the display element 102a and the display element 102b include liquid crystal molecules, the alignment conditions of the liquid crystal molecules can be different from each other. Consequently, viewing angle characteristics can be improved.

Figure 5:
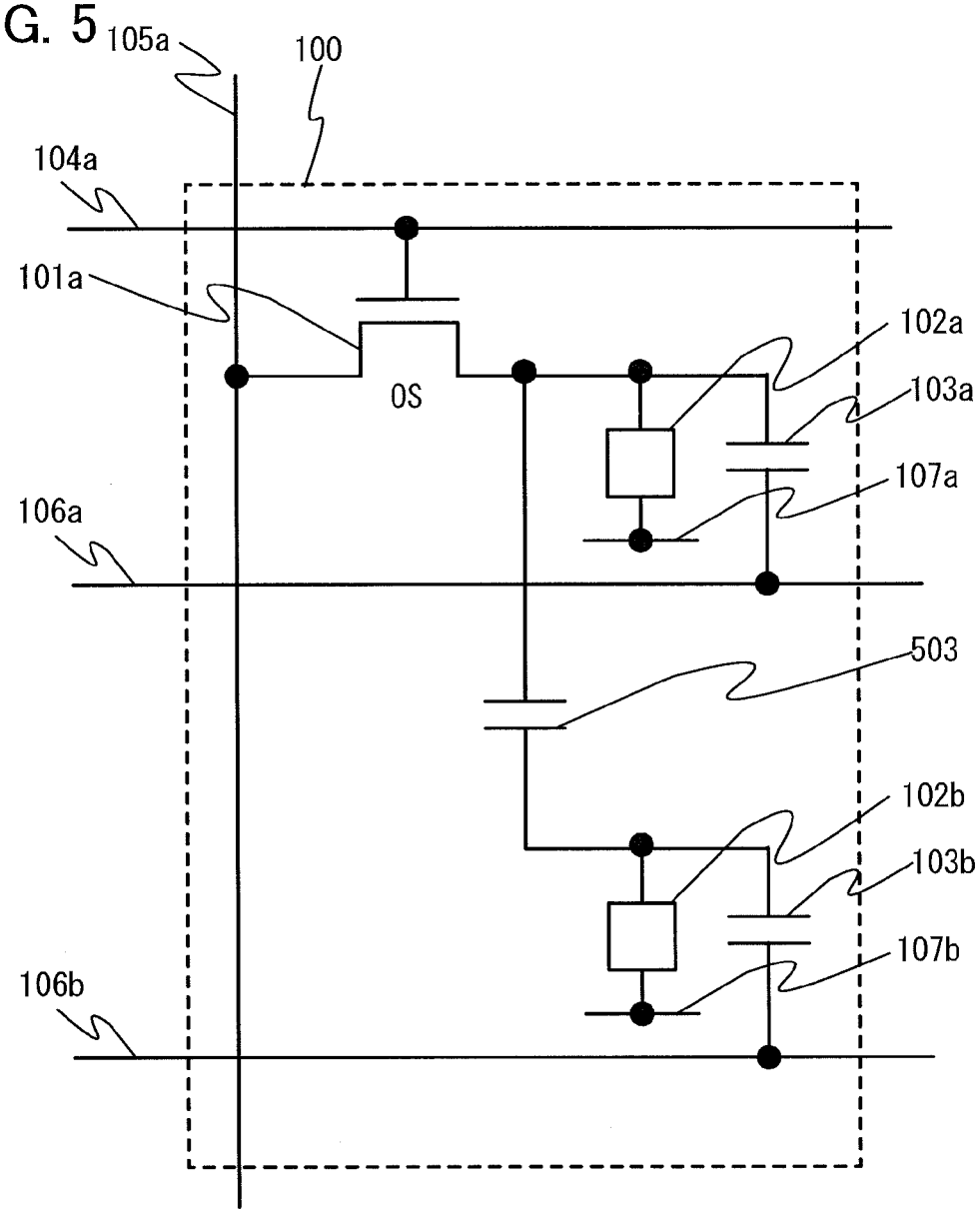
FIG. 5 is a circuit diagram illustrating a semiconductor device.

Next, FIG. 5 illustrates another example of the pixel circuit including subpixels.

In FIG. 5, the wiring 104b and the transistor 101b are not provided and a capacitor 503 is added in the circuit in FIG. 1. In FIG. 5, the wiring 105b and the transistor 101b are not provided and the capacitor 503 is added in the circuit in FIG. 3. In FIG. 5, the transistor 101b is not provided and the capacitor 503 is added in the circuit in FIG. 4. The contents described with reference to FIG. 1, FIG. 2, FIG. 3, and FIG. 4 therefore can be applied to FIG. 5. In FIG. 5, the first terminal of the display element 102b is connected to a first terminal of the capacitor 503, and a second terminal of the capacitor 503 is connected to the second terminal of the transistor 101a. Except for these, FIG. 5 is similar to FIG. 1, FIG. 3, or FIG. 4.

Next, an example of the operation of the pixel 100 illustrated in FIG. 5 is described. First, a selection signal is supplied to the wiring 104a. Consequently, the transistor 101a is turned on. At this time, an image signal corresponding to the display element 102a and the display element 102b is supplied to the wiring 105a. Accordingly, voltage whose level is different from the level of voltage supplied to the display element 102a is supplied to the display element 102b with capacitive coupling because the capacitor 503 is provided. Thus, the display element 102a and the display element 102b can be set to be in different states. For example, in the case where the display element 102a and the display element 102b include liquid crystal molecules, the alignment conditions of the liquid crystal molecules can be different from each other. Consequently, viewing angle characteristics can be improved.

Figure 6:
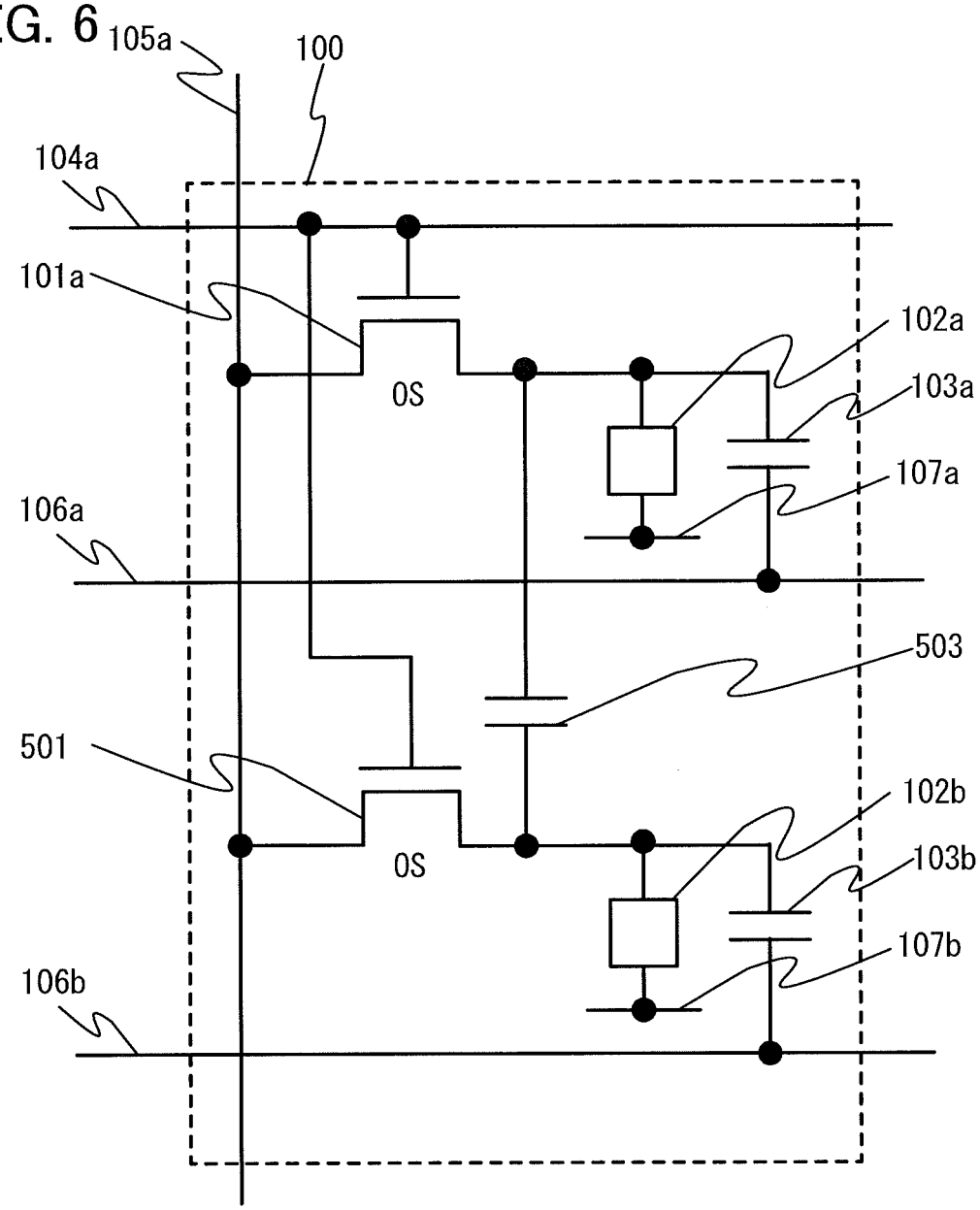
FIG. 6 is a circuit diagram illustrating a semiconductor device.

Next, FIG. 6 illustrates another example of the pixel circuit including subpixels.

In FIG. 6, a transistor 501 is added to the circuit in FIG. 5. In FIG. 6, the wiring 104b and the transistor 101b are not provided and the capacitor 503 and the transistor 501 are added in the circuit in FIG. 1. In FIG. 6, the wiring 105b and the transistor 101b are not provided and the capacitor 503 and the transistor 501 are added in the circuit in FIG. 3. In FIG. 6, the transistor 101b is not provided and the capacitor 503 and the transistor 501 are added in the circuit in FIG. 4. The contents described with reference to FIG. 1, FIG. 2, FIG. 3, FIG. 4, and FIG. 5 therefore can be applied to FIG. 6. In FIG. 6, the first terminal of the display element 102b is connected to the first terminal of the capacitor 503, and the second terminal of the capacitor 503 is connected to the second terminal of the transistor 101a. A gate of the transistor 501 is connected to the wiring 104a. A first terminal of the transistor 501 is connected to the wiring 105a. A second terminal of the transistor 501 is connected to the first terminal of the display element 102a. Except for these, FIG. 6 is similar to FIG. 1, FIG. 3, FIG. 4, or FIG. 5.

Here, when the transistor 501 is on, it can function as a resistor. Thus, the on resistance of the transistor 501 is preferably higher than the on resistance of the transistor 101a; however, one aspect of one embodiment of the present invention is not limited to this. For example, the channel length or gate length of the transistor 501 is longer than the channel length or gate length of the transistor 101a. As another example, the channel width or gate width of the transistor 501 is smaller than the channel width or gate width of the transistor 101a. As another example, the ratio of the channel width or gate width to the channel length or gate length of the transistor 501 is smaller than the ratio of the channel width or gate width to the channel length or gate length of the transistor 101a.

Next, an example of the operation of the pixel 100 illustrated in FIG. 6 is described. First, a selection signal is supplied to the wiring 104a. Consequently, the transistor 101a and the transistor 501 are turned on. At this time, an image signal corresponding to the display element 102a and the display element 102b is supplied to the wiring 105a. Accordingly, voltage whose level is different from the level of voltage supplied to the display element 102a is supplied to the display element 102b with capacitive coupling of the capacitor 503 and the high on resistance of the transistor 501. Thus, the display element 102a and the display element 102b can be set to be in different states. For example, in the case where the display element 102a and the display element 102b include liquid crystal molecules, the alignment conditions of the liquid crystal molecules can be different from each other. Consequently, viewing angle characteristics can be improved. Further, with the transistor 501, electrical charge can be prevented from being accumulated in the first terminal of the capacitor 503 or the first terminal of the display element 102b. Thus, image burn-in can be reduced.

Figure 7:
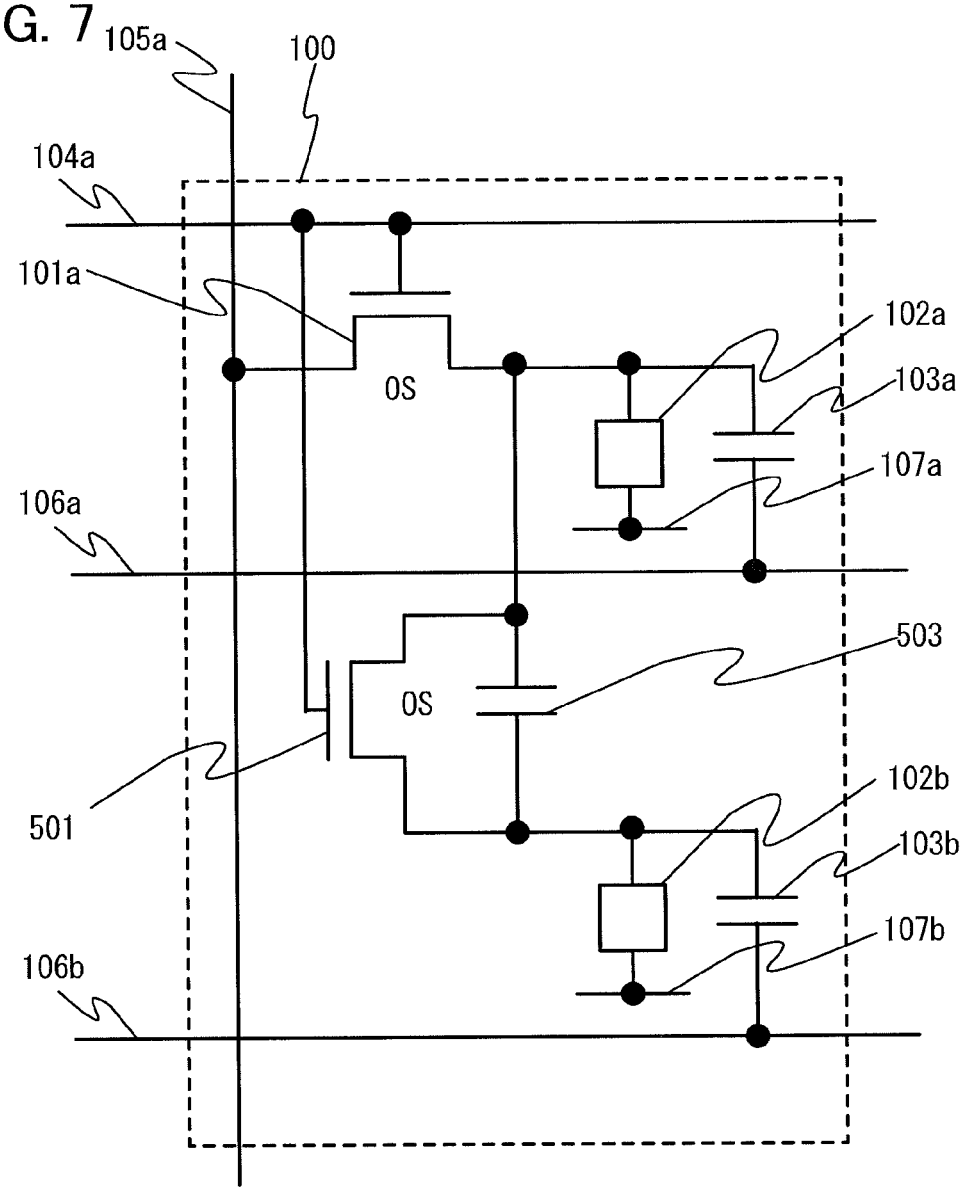
FIG. 7 is a circuit diagram illustrating a semiconductor device.

Note that although the first terminal of the transistor 501 is connected to the wiring 105a, one aspect of one embodiment of the present invention is not limited to this. For example, as illustrated in FIG. 7, the first terminal of the transistor 501 can be connected to the second terminal of the capacitor 503 or the second terminal of the transistor 101a.

Note that in FIG. 1, FIG. 2, FIG. 3, FIG. 4, FIG. 5, FIG. 6, and FIG. 7, a certain wiring and a different wiring are put together into one wiring so that the number of wirings can be reduced. Thus, the aperture ratio can be improved. For example, the wiring 106a and the wiring 106b can be put together into one wiring. That is, the wiring 106a and the wiring 106b can be put together into one wiring 106a; thus, the wiring 106b can be eliminated. In that case, an element or elements that are connected to the wiring 106b are connected to the wiring 106a.

Alternatively, the wiring 106a and a different wiring (e.g., the wiring 106b) included in a pixel other than the pixel 100 are put together into one wiring so that the number of wirings can be reduced. That is, the wiring 106a and the wiring 106b in the different pixel can be put together into one wiring 106a; thus, the wiring 106b in the different pixel can be eliminated. In that case, an element or elements that are connected to the wiring 106b in the different pixel are connected to the wiring 106a.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In particular, in the case where the number of portions to which the terminal is connected might be plural, it is not necessary to specify the portions to which the terminal is connected. Thus, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. It might be possible for those skilled in the art to specify the invention when at least the function of a circuit is specified. Thus, when the connection portion of a circuit is specified, the circuit is disclosed as one embodiment of the invention even when the function of the circuit is not specified, and one embodiment of the invention can be constituted. When the function of a circuit is specified, the circuit is disclosed as one embodiment of the invention even when the connection portion of the circuit is not specified, and one embodiment of the invention can be constituted.

In this specification and the like, when an object is explicitly described in a singular form, the object is preferably singular. Note that without limitation to this, the object can be plural. Similarly, when an object is explicitly described in a plural form, the object is preferably plural. Note that without limitation to this, the object can be singular.

Embodiment 2

Figure 8:
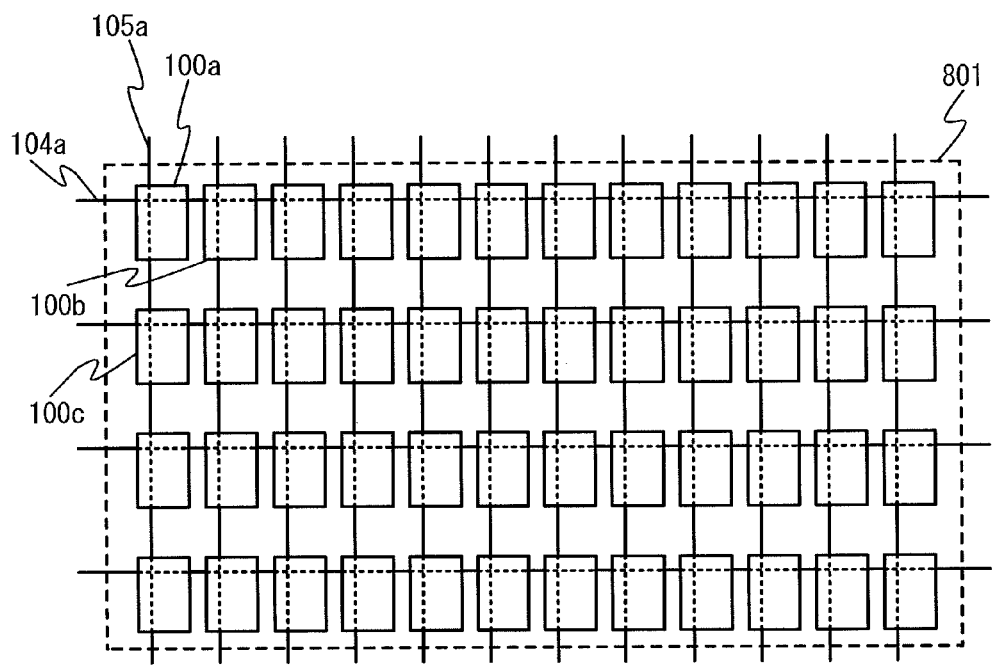
FIG. 8 is a circuit diagram illustrating a semiconductor device.

FIG. 8 illustrates a structure example of a semiconductor device or the like in this embodiment. In one aspect of this embodiment, a pixel portion 801 is provided. Note that one aspect of one embodiment of the present invention is not limited to this.

A plurality of pixels are arranged in matrix in the pixel portion 801. For example, a pixel 100a and a pixel 100b are aligned in a lateral direction. Further, the pixel 100a and a pixel 100c are aligned in a longitudinal direction. The pixels are connected to each other with wirings. The pixels arranged in the longitudinal direction are connected to each other with a wiring extended in a vertical direction. The pixels arranged in the lateral direction are connected to each other with a wiring extended in a horizontal direction. For example, the pixel 100a and the pixel 100b are connected to each other with the wiring 104a. Furthermore, the pixel 100a and the pixel 100c are connected to each other with the wiring 105a. Note that the pixels can be connected to each other with a different wiring, for example, a wiring extended in the horizontal direction (e.g., a capacitor wiring, a gate line for a different subpixel, or a source line for a different subpixel) or a wiring to which all the pixels are connected (e.g., a common wiring or a power supply line). Further, pixels other than the pixels 100a to 102c are arranged and connected in a similar manner.

Here, the pixel 100a, the pixel 100b, the pixel 100c, and the like each correspond to any of the pixels 100 illustrated in FIG. 1, FIG. 2, FIG. 3, FIG. 4, FIG. 5, FIG. 6, and FIG. 7, for example.

Note that in this specification and the like, pixels might be provided (arranged) in matrix. Here, description that pixels are provided (arranged) in matrix includes the case where the pixels are arranged in a straight line and the case where the pixels are arranged in a jagged line, in a longitudinal direction or a lateral direction. Thus, for example, when full color display is performed with three color elements (e.g., R, G, and B), the following cases are included: the case where the pixels are arranged in stripes, the case where dots of the three color elements are arranged in a delta pattern, the case where the dots of the three color elements are provided in Bayer arrangement, the case where the dots of the three color elements are provided in a mosaic pattern. Note that the size of display regions may be different between dots of color elements. Thus, power consumption can be reduced or the life of a display element can be prolonged.

Figure 9A:
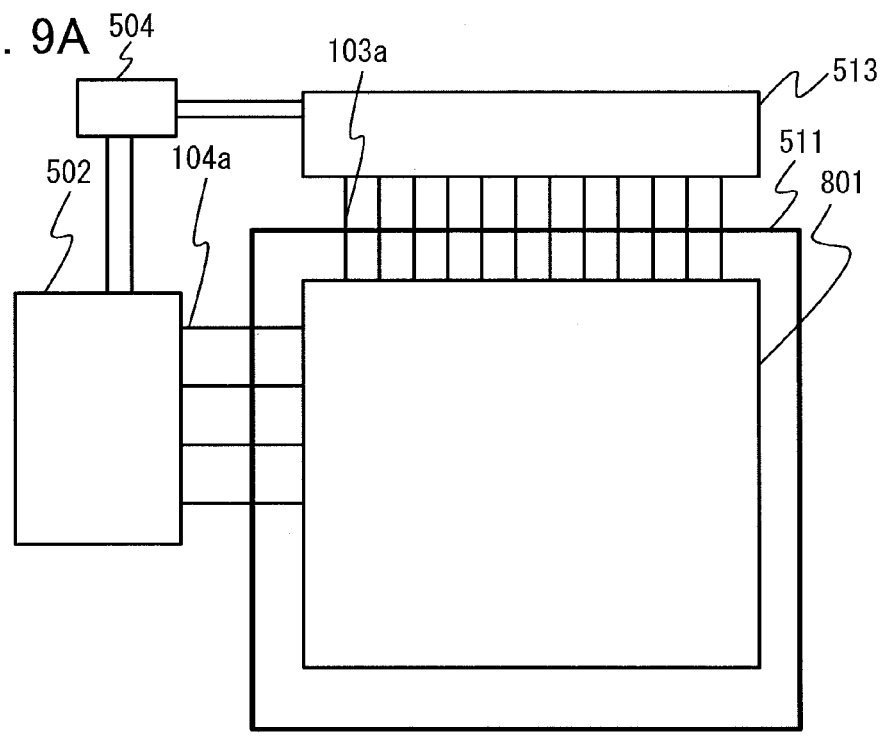
FIGS. 9A and 9B are circuit diagrams each illustrating a semiconductor device.

FIG. 9A illustrates the pixel portion 801 and examples of peripheral circuits. The pixel portion 801 is provided over a substrate 511. A transistor and a wiring included in the pixel portion 801 are formed, etched, and patterned concurrently. That is, the transistor and the wiring included in the pixel portion 801 are formed concurrently over one substrate through the same process. Thus, the materials of the transistor and the wiring included in the pixel portion 801 are the same.

In FIG. 9A, a circuit 502, a circuit 513, and a circuit 504 are formed over substrates which are different from the substrate 511. For example, the circuit 502, the circuit 513, or the circuit 504 includes an IC chip formed using a single crystal substrate or an SOI substrate. Note that the circuit 502, the circuit 513, and/or the circuit 504 might be provided over the substrate 511 by COG.

Here, the circuit 502 has a function of supplying signals to the wiring 104a and the like; thus, the circuit 502 can function as a gate line driver circuit (a scan driver). The circuit 513 has a function of supplying signals to the wiring 105a and the like; thus, the circuit 513 can function as a signal line driver circuit (a data driver). The circuit 504 has a function of controlling the circuit 502 or the circuit 513; thus, the circuit 504 can function as a controller, a pulse generation circuit, a clock signal generation circuit, a common voltage generation circuit, a timing generator circuit, an image processing circuit, a power supply circuit, or the like.

Figure 9B:
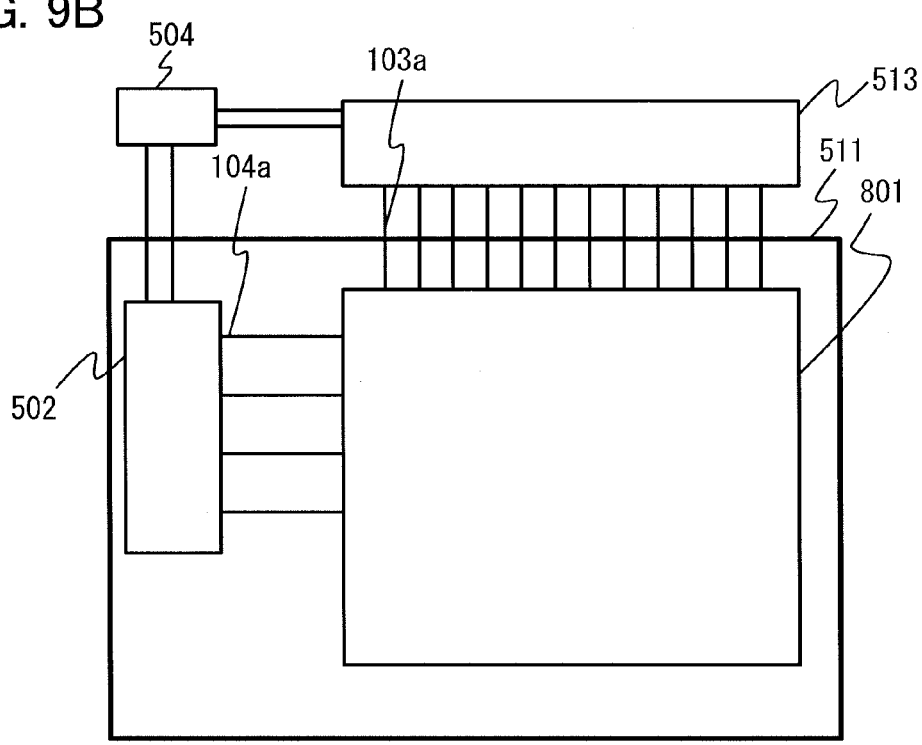

Note that in FIG. 9A, the circuit 502, the circuit 513, and the circuit 504 are provided over substrates which are different from the substrate 511; however, one aspect of one embodiment of the present invention is not limited to this. For example, some of these circuits can be provided over the substrate 511. For example, FIG. 9B illustrates an example of the case where the circuit 502 is provided over the substrate 511. In FIG. 9B, a transistor and a wiring included in the pixel portion 801 and a transistor and a wiring included in the circuit 502 are formed, etched, and patterned concurrently. That is, the pixel portion 801 and the circuit 502 are formed concurrently over one substrate through the same process. Thus, the materials of the transistor and the wiring included in the pixel portion 801 are the same as those of the transistor and the wiring included in the circuit 502. For that reason, when the transistor in the pixel portion 801 includes an oxide semiconductor, the transistor in the circuit 502 also includes the oxide semiconductor.

When the circuit 502 is formed over the same substrate as the pixel portion 801 in this manner, cost can be reduced. In particular, in the case where the circuit 502 operates as a gate line driver circuit, its operation speed is not so high. Thus, for example, even when the mobility of the transistor included in the circuit 502 is not high, the circuit 502 can operate adequately.

As an example which is different from the example of FIG. 9B, the circuit 513 or part of the circuit 513 can also be provided over the substrate 511. As an example of part of the circuit 513, an analog switch (a transfer gate) can be connected to the wiring 105a or the like. Similarly, the circuit 504 or part of the circuit 504 can also be provided over the substrate 511.

Note that in this specification and the like, a transistor can be formed using a variety of substrates, without limitation to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As a glass substrate, a barium borosilicate glass substrate, an aluminoborosilicate glass substrate, a soda-lime glass substrate, or the like can be used, for example. For a flexible substrate, a flexible synthetic resin such as plastics typified by polyethylene terephthalate (PET), polyethylene naphthalate (PEN), or polyether sulfone (PES), or acrylic can be used, for example. For an attachment film, polypropylene, polyester, vinyl, polyvinyl fluoride, polyvinyl chloride, or the like can be used, for example. For a base material film, polyester, polyamide, polyimide, an inorganic vapor deposition film, paper, or the like can be used, for example. In particular, by forming transistors with the use of a semiconductor substrate, a single crystal substrate, an SOI substrate, or the like, transistors with fewer variations in characteristics, sizes, shapes, or the like, with high current supply capability, and with small sizes can be formed. By forming a circuit with the use of such a transistor, power consumption of the circuit can be reduced or the circuit can be highly integrated.

Note that the transistor may be formed using one substrate, and then, the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. With the use of such a substrate, a transistor with excellent properties or a transistor with low power consumption can be formed, a device with high durability and high heat resistance can be provided, or reduction in weight or thickness can be achieved.

Note that all the circuits that are necessary to realize a predetermined function can be formed using one substrate (e.g., a glass substrate, a plastic substrate, a single crystal substrate, or an SOI substrate). Thus, cost can be reduced by reduction in the number of components or reliability can be improved by reduction in the number of connections to circuit components.

Note that it is possible not to form all the circuits that are necessary to realize the predetermined function over one substrate. That is, some of the circuits which are necessary to realize the predetermined function can be formed using one substrate and some of the circuits which are necessary to realize the predetermined function can be formed using another substrate. For example, some of the circuits which are necessary to realize the predetermined function can be formed using a glass substrate and some of the circuits which are necessary to realize the predetermined function can be formed using a single crystal substrate (or an SOI substrate). The single crystal substrate over which some of the circuits which are necessary to realize the predetermined function (such a substrate is also referred to as an IC chip) can be connected to the glass substrate by COG, and the IC chip can be provided over the glass substrate. Alternatively, the IC chip can be connected to the glass substrate by TAB (tape automated bonding), COF (chip on film), SMT (surface mount technology), a printed circuit board, or the like. When some of the circuits are formed using the same substrate as a pixel portion in this manner, cost can be reduced by reduction in the number of components or reliability can be improved by reduction in the number of connections to circuit components. In particular, a circuit with high drive voltage, a circuit with high drive frequency, or the like consumes a large amount of power in many cases. Thus, such a circuit is formed using a substrate which is different from the substrate over which the pixel portion is formed (e.g., a single crystal substrate), and an IC chip is formed. With the IC chip, the increase in power consumption can be prevented.

The off-state current of a transistor including an oxide semiconductor is low; thus, defects caused by off-state current can be reduced when a semiconductor device or the like including an oxide semiconductor is used. Thus, images can be displayed more accurately.

A thin film transistor including an intrinsic (i-type) oxide semiconductor layer as an active layer is particularly preferable because the off-state current of the thin film transistor is low. As a method for making an oxide semiconductor layer intrinsic (i-type), dehydration or dehydrogenation is effective.

Embodiment 3

In this embodiment, different examples of the pixel 100 are described.

Although the pixels 100 illustrated in FIG. 1, FIG. 2, FIG. 3, FIG. 4, FIG. 5, FIG. 6, and FIG. 7 each include two subpixels, the number of subpixels is not limited to two. For example, FIG. 10 illustrates an example in which the pixel 100 illustrated in FIG. 1 includes three subpixels.

Figure 10:
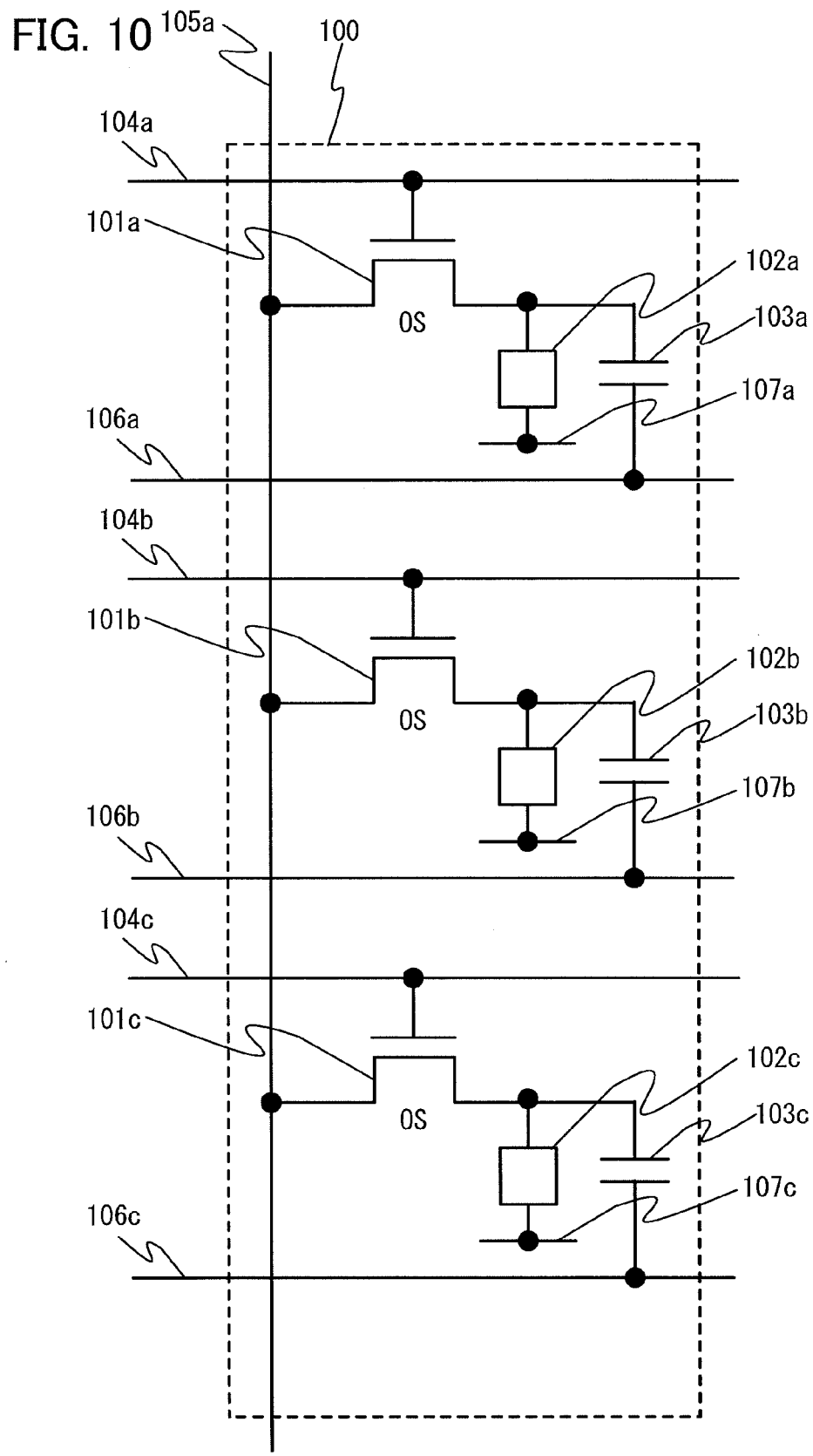
FIG. 10 is a circuit diagram illustrating a semiconductor device.

In the pixel 100 illustrated in FIG. 10, a transistor 101c, a display element 102c, and a capacitor 103c are added to the pixel 100 illustrated in FIG. 1. A gate of the transistor 101c is connected to a wiring 104c. A first terminal of the transistor 101c is connected to the wiring 105a. A second terminal of the transistor 101c is connected to a first terminal of the display element 102c. A second terminal of the display element 102c is connected to a wiring 107c. A first terminal of the capacitor 103c is connected to the first terminal of the display element 102c. A second terminal of the capacitor 103c is connected to a wiring 106c.

Note that the number of subpixels can be increased in a similar manner also in the circuits in FIG. 2, FIG. 3, and FIG. 4.

Figure 11:
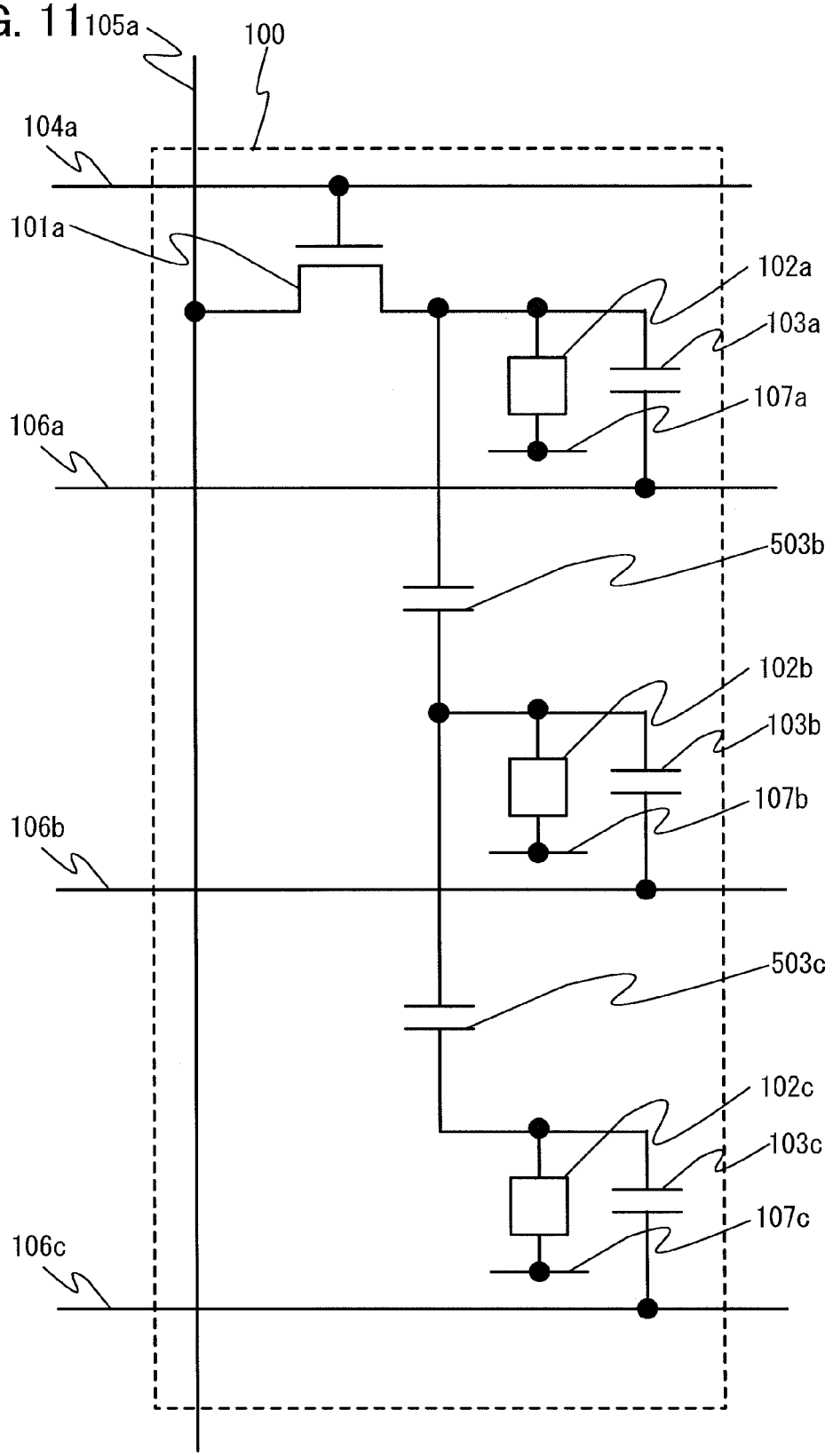
FIG. 11 is a circuit diagram illustrating a semiconductor device.

Next, FIG. 11 illustrates an example in which the pixel 100 illustrated in FIG. 5 includes three subpixels. In the pixel 100 illustrated in FIG. 11, the display element 102c and a capacitor 503c are added to the pixel 100 illustrated in FIG. 5. A capacitor 503b in FIG. 11 corresponds to the capacitor 503 in FIG. 5. The first terminal of the display element 102c is connected to a first terminal of the capacitor 503c. A second terminal of the capacitor 503c is connected to a first terminal of the capacitor 503b. The second terminal of the display element 102c is connected to the wiring 107c. The first terminal of the capacitor 103c is connected to the first terminal of the display element 102c. The second terminal of the capacitor 103c is connected to the wiring 106c.

Figure 12:
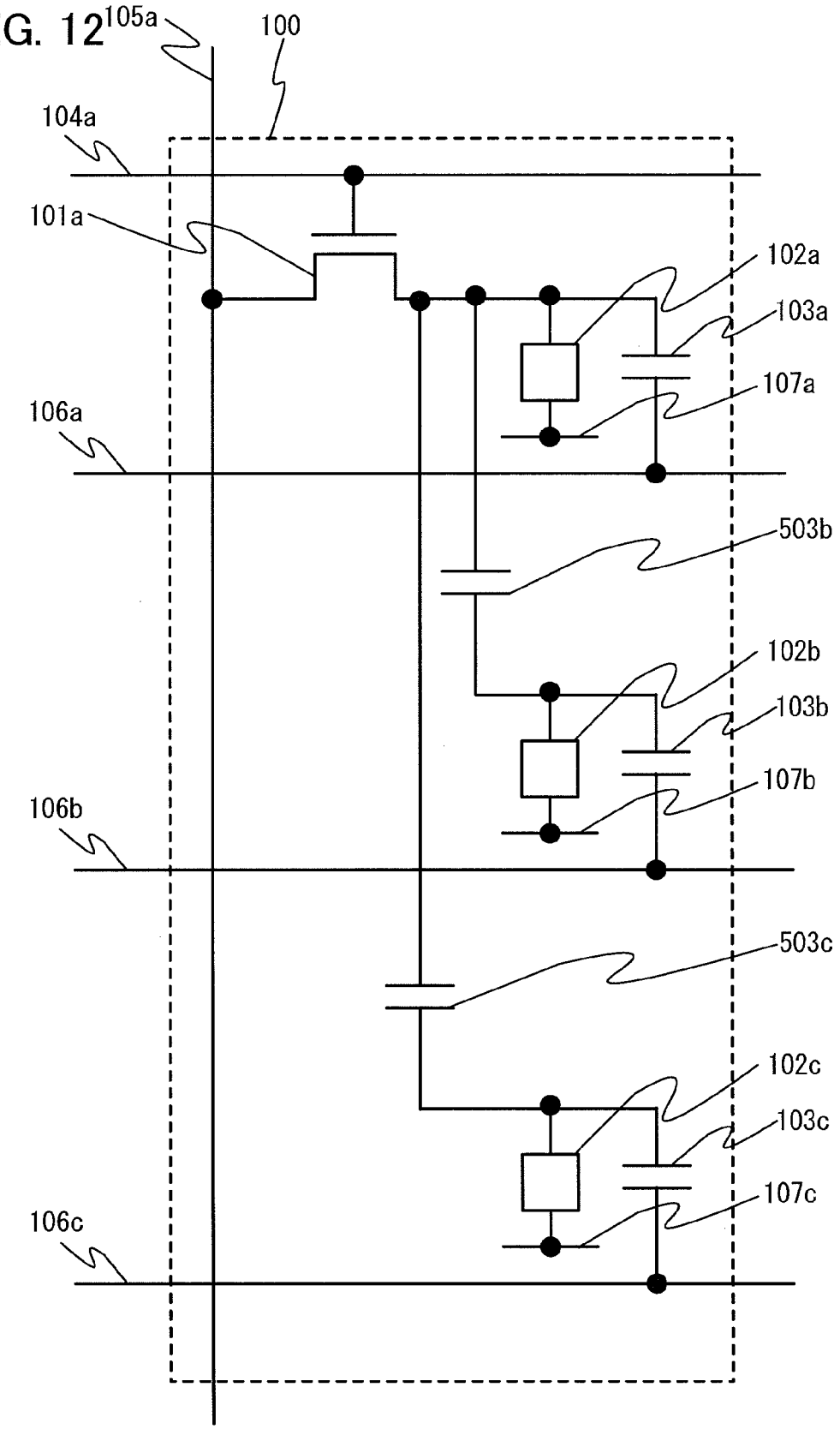
FIG. 12 is a circuit diagram illustrating a semiconductor device.

FIG. 12 illustrates an example in which part of connection is different from the connection in FIG. 11. In FIG. 12, the second terminal of the capacitor 503c is connected to the second terminal of the transistor 101a. Except for this, FIG. 12 is similar to FIG. 11.

Figure 13:
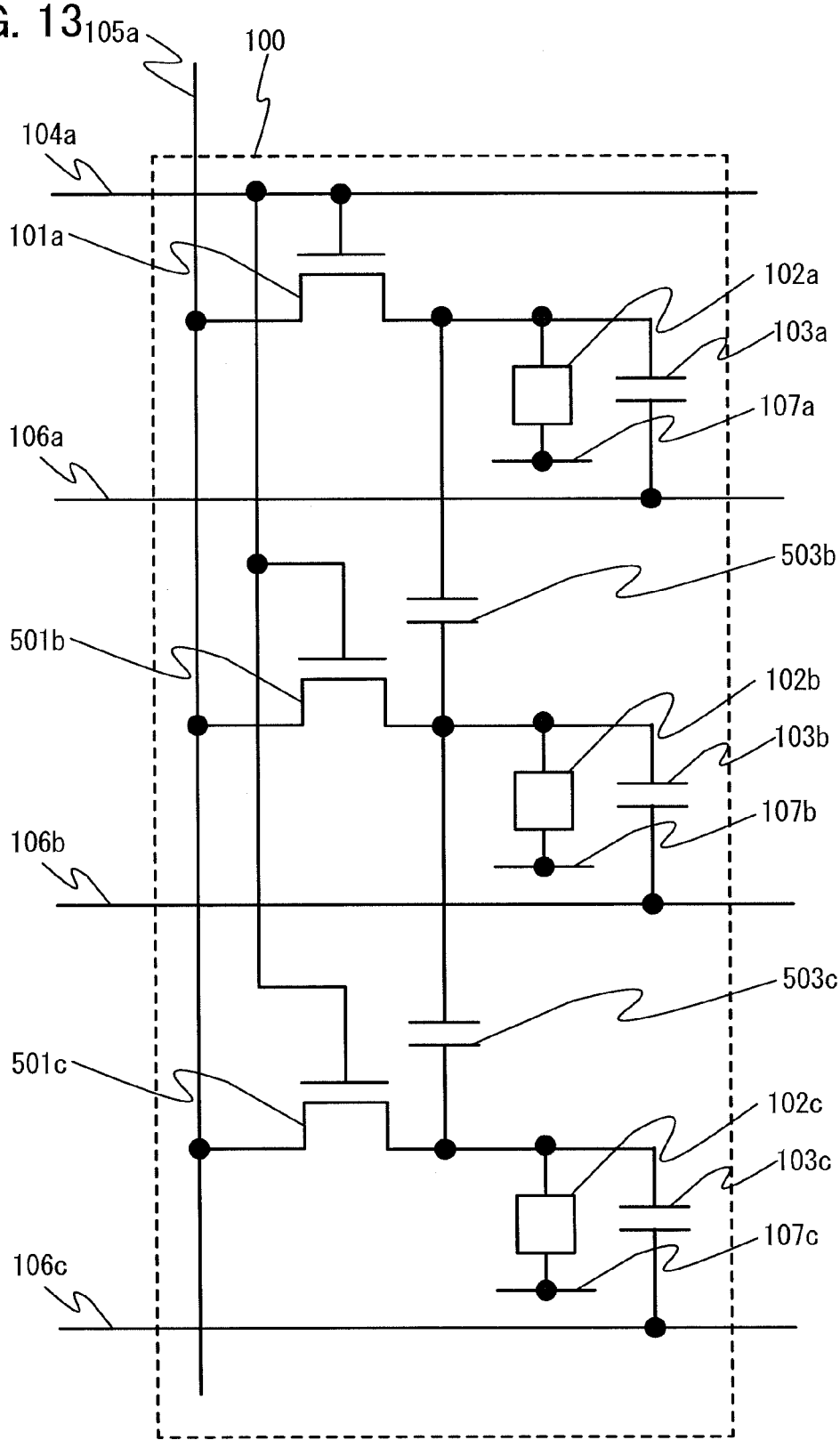
FIG. 13 is a circuit diagram illustrating a semiconductor device.

Next, FIG. 13 illustrates an example in which the pixel 100 illustrated in FIG. 6 includes three subpixels. In the pixel 100 illustrated in FIG. 13, the display element 102c, the capacitor 503c, and a transistor 501c are added to the pixel 100 illustrated in FIG. 6. The capacitor 503b in FIG. 13 corresponds to the capacitor 503 in FIG. 6. A transistor 501b in FIG. 13 corresponds to the transistor 501 in FIG. 6. In FIG. 13, the transistor 501b and the transistor 501c are added to the pixel 100 illustrated in FIG. 11. In FIG. 13, the first terminal of the display element 102c is connected to the first terminal of the capacitor 503c, and the second terminal of the capacitor 503c is connected to the first terminal of the capacitor 503b. A gate of the transistor 501c is connected to the wiring 104a. A first terminal of the transistor 501c is connected to the wiring 105a. A second terminal of the transistor 501c is connected to the first terminal of the display element 102c. The second terminal of the display element 102c is connected to the wiring 107c. The first terminal of the capacitor 103c is connected to the first terminal of the display element 102c. The second terminal of the capacitor 103c is connected to the wiring 106c.

Note that although a first terminal of the transistor 501b is connected to the wiring 105a, one aspect of one embodiment of the present invention is not limited to this. For example, the first terminal of the transistor 501b can be connected to the first terminal of the capacitor 503c, a second terminal of the capacitor 503b, or the like.

Note that although the first terminal of the transistor 501c is connected to the wiring 105a, one aspect of one embodiment of the present invention is not limited to this. For example, the first terminal of the transistor 501c can be connected to the first terminal of the capacitor 503b, the second terminal of the capacitor 503b, or the like.

Note that although the second terminal of the capacitor 503c is connected to the first terminal of the capacitor 503b, one aspect of one embodiment of the present invention is not limited to this. For example, the second terminal of the capacitor 503c can be connected to the second terminal of the capacitor 503b or the like.

The off-state current of a transistor including an oxide semiconductor is low; thus, defects caused by off-state current can be reduced when a semiconductor device or the like including an oxide semiconductor is used. Thus, images can be displayed more accurately.

A thin film transistor including an intrinsic (i-type) oxide semiconductor layer as an active layer is particularly preferable because the off-state current of the thin film transistor is low. As a method for making an oxide semiconductor layer intrinsic (i-type), dehydration or dehydrogenation is effective.

Embodiment 4

In this embodiment, different examples of the pixel 100 are described.

Figure 14:
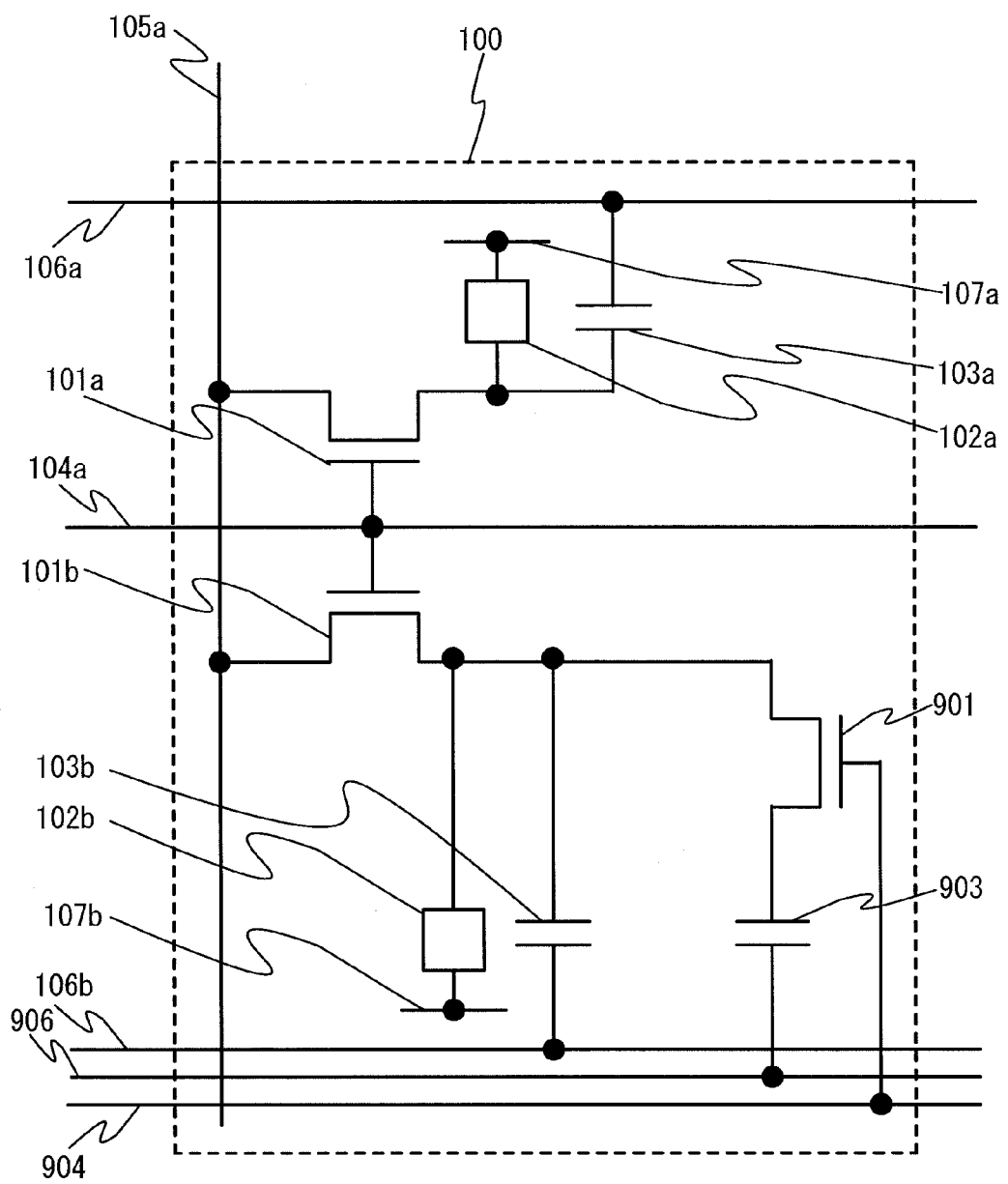
FIG. 14 is a circuit diagram illustrating a semiconductor device.

In the pixel 100 illustrated in FIG. 14, a transistor 901 and a capacitor 903 are added to the pixel 100 illustrated in FIG. 4. A gate of the transistor 901 is connected to a wiring 904. A first terminal of the transistor 901 is connected to the first terminal of the display element 102b. A second terminal of the transistor 901 is connected to a first terminal of the capacitor 903. A second terminal of the capacitor 903 is connected to a wiring 906.

Note that here, the capacitor 903 has a function of controlling the amount of electrical charge supplied to the display element 102b or the capacitor 103b. Alternatively, the capacitor 903 has a function of holding the potential of a pixel electrode of the display element 102b.

Here, the wiring 904 is connected to a gate of a transistor included in a pixel in some cases. Thus, the wiring 904 can function as a gate signal line, a gate wiring, a gate line, or the like. Alternatively, the wiring 904 is supplied with a signal for selecting rows one by one and the signal is scanned in some cases. Thus, the wiring 904 can function as a scan signal line, a scan wiring, a scan line, or the like. Alternatively, the wiring 904 can have a function of controlling the amount of electrical charge accumulated in the capacitor 903.

Here, the wiring 906 can be connected to other pixels, for example, right and left pixels. Further, predetermined voltage is supplied to the wiring 906. Alternatively, a signal is supplied to at least one row in some cases. Thus, the wiring 906 can function as a common wiring, a capacitor wiring, or the like.

Next, an example of the operation of the pixel 100 illustrated in FIG. 14 is described. First, a selection signal is supplied to the wiring 104*a*. Consequently, the transistor 101*a* and the transistor 101*b* are turned on. At this time; an image signal corresponding to the display element 102*a* and the display element 102*b* is supplied to the wiring 105*a*. Then, a non-selection signal is supplied to the wiring 104*a*. Consequently, the transistor 101*a* and the transistor 101*b* are turned off. After that, a selection signal is supplied to the wiring 904. Consequently, electrical charge is redistributed in the capacitor 903, the capacitor 103*b*, and the display element 102*b*. That is, the electrical charge is moved in the capacitor 903, the capacitor 103*b*, and the display element 102*b*. After that, a non-selection signal is supplied to the wiring 904. Consequently, the level of voltage applied to the display element 102*b* is changed. Accordingly, voltages whose levels are different from each other can be supplied to the display element 102*a* and the display element 102*b*. Thus, the display element 102*a* and the display element 102*b* can be set to be in different states. For example, in the case where the display element 102*a* and the display element 102*b* include liquid crystal molecules, the alignment conditions of the liquid crystal molecules can be different from each other. Consequently, viewing angle characteristics can be improved.

The area or capacitance value of the capacitor 903 is preferably smaller than that of the capacitor 103*b* because a difference between the voltage of the display element 102*b* and the voltage of the display element 102*a* can be prevented from being too large. Note that one aspect of one embodiment of the present invention is not limited to this.

Note that the channel length or gate length of the transistor 101*a* (or the transistor 101*b*) is substantially equal to the channel length or gate length of the transistor 901. As another example, the channel width or gate width of the transistor 101*a* is substantially equal to the channel width or gate width of the transistor 101*b*. As another example, the ratio of the channel width or gate width to the channel length or gate length of the transistor 101*a* is substantially equal to the ratio of the channel width or gate width to the channel length or gate length of the transistor 101*b*. Thus, signals can be supplied to display elements in a balanced manner; however, one aspect of one embodiment of the present invention is not limited to this.

Note that for example, the channel length or gate length of the transistor 101*a* (or the transistor 101*b*) is shorter than the channel length or gate length of the transistor 901. As another example, the channel width or gate width of the transistor 101*a* (or the transistor 101*b*) is larger than the channel width or gate width of the transistor 901. As another example, the ratio of the channel width or gate width to the channel length or gate length of the transistor 101*a* (or the transistor 101*b*) is larger than the ratio of the channel width or gate width to the channel length or gate length of the transistor 901. It is not necessary that a large amount of current flow through the transistor 901; thus, current supply capability can be made small. Thus, the aperture ratio can be improved. Note that one aspect of one embodiment of the present invention is not limited to this.

Here, the transistor 101*a*, the transistor 101*b*, and the transistor 901 can include an oxide semiconductor whose off-state current is low. Thus, even when the pixel 100 includes a plurality of subpixels and the capacitance value of the display element or the capacitor is decreased, voltage held by the display element or the capacitor can be prevented from being changed by the off-state current of the transistor.

Note that a certain wiring and a different wiring are put together into one wiring so that the number of wirings can be reduced. Thus, the aperture ratio can be improved. For example, the wiring 906 and the wiring 106*b* can be put together into one wiring. That is, the wiring 906 and the wiring 106*b* can be put together into one wiring 106*b*; thus, the wiring 906 can be eliminated. In that case, an element or elements that are connected to the wiring 906 are connected to the wiring 106*b*.

Alternatively, the wiring 106*a* and the wiring 106*b* can be put together into one wiring. That is, the wiring 106*a* and the wiring 106*b* can be put together into one wiring 106*b*; thus, the wiring 106*a* can be eliminated. In that case, an element or elements that are connected to the wiring 106*a* are connected to the wiring 106*b*.

Alternatively, the wiring 906 (or the wiring 106*a* or 106*b*) and a different wiring (e.g., the wiring 106*b*) included in a pixel other than the pixel 100 are put together into one wiring so that the number of wirings can be reduced. That is, the wiring 906 (or the wiring 106*a* or 106*b*) and the wiring 106*b* in the different pixel can be put together into one wiring 906 (or one wiring 106*a* or 106*b*); thus, the wiring 106*b* in the different pixel can be eliminated. In that case, an element or elements that are connected to the wiring 106*b* in the different pixel are connected to the wiring 906 (or the wiring 106*a* or 106*b*).

Alternatively, the wiring 904 and a different wiring (e.g., the wiring 104*a*) included in a pixel other than the pixel 100 are put together into one wiring so that the number of wirings can be reduced. That is, the wiring 904 and the wiring 104*a* in the different pixel can be put together into one wiring 104*a*; thus, the wiring 904 can be eliminated. In that case, an element or elements that are connected to the wiring 904 are connected to the wiring 104*a* in the different pixel.

Figure 15:
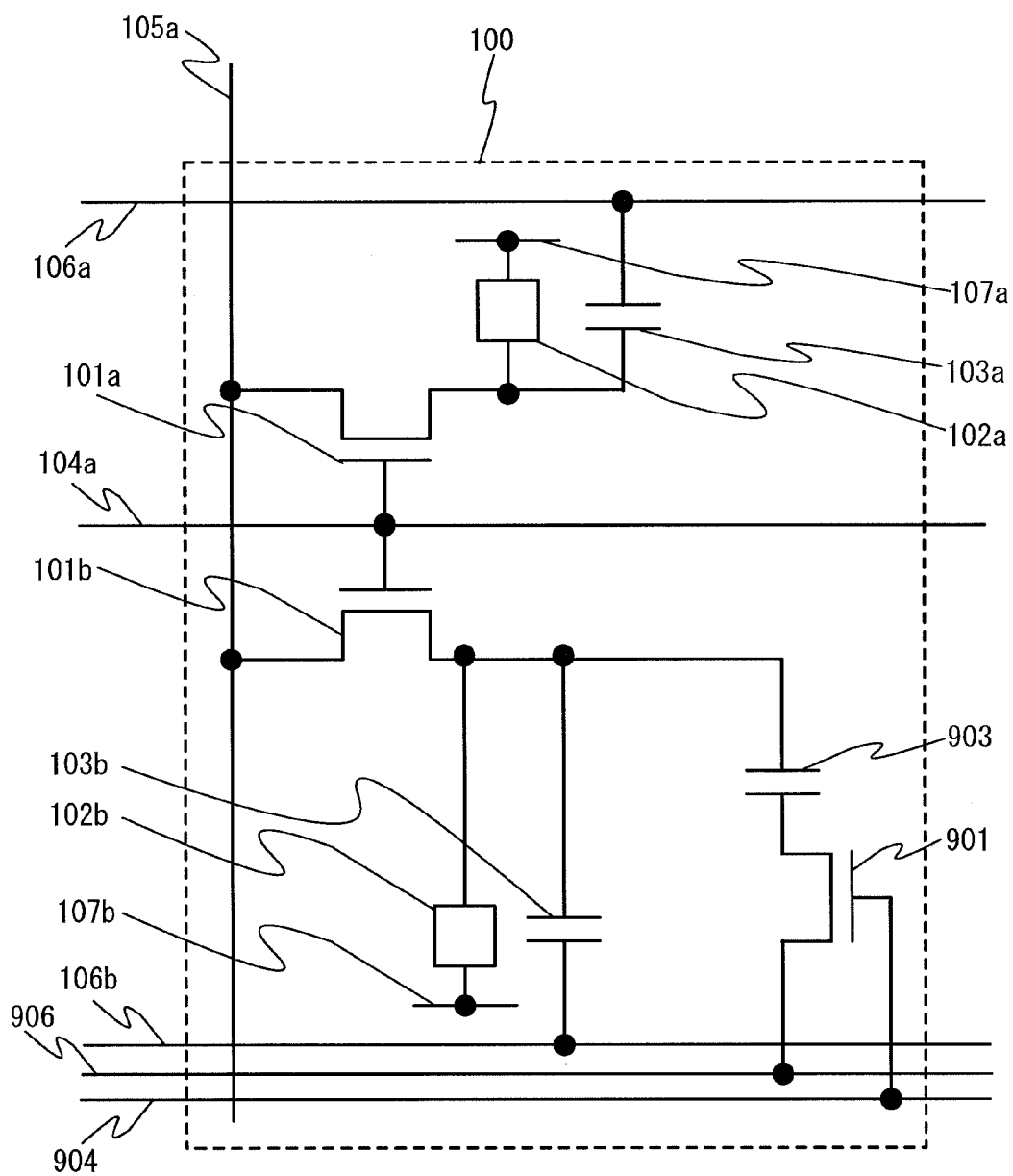
FIG. 15 is a circuit diagram illustrating a semiconductor device.

Note that the second terminal of the transistor 101*b* is connected to the wiring 906 through the transistor 901 and the capacitor 903 in that order; however, the connection order of the transistor 901 and the capacitor 903 can be changed. For example, as illustrated in FIG. 15, the second terminal of the transistor 101*b* can be connected to the wiring 906 through the capacitor 903 and the transistor 901 in that order.

Figure 16:
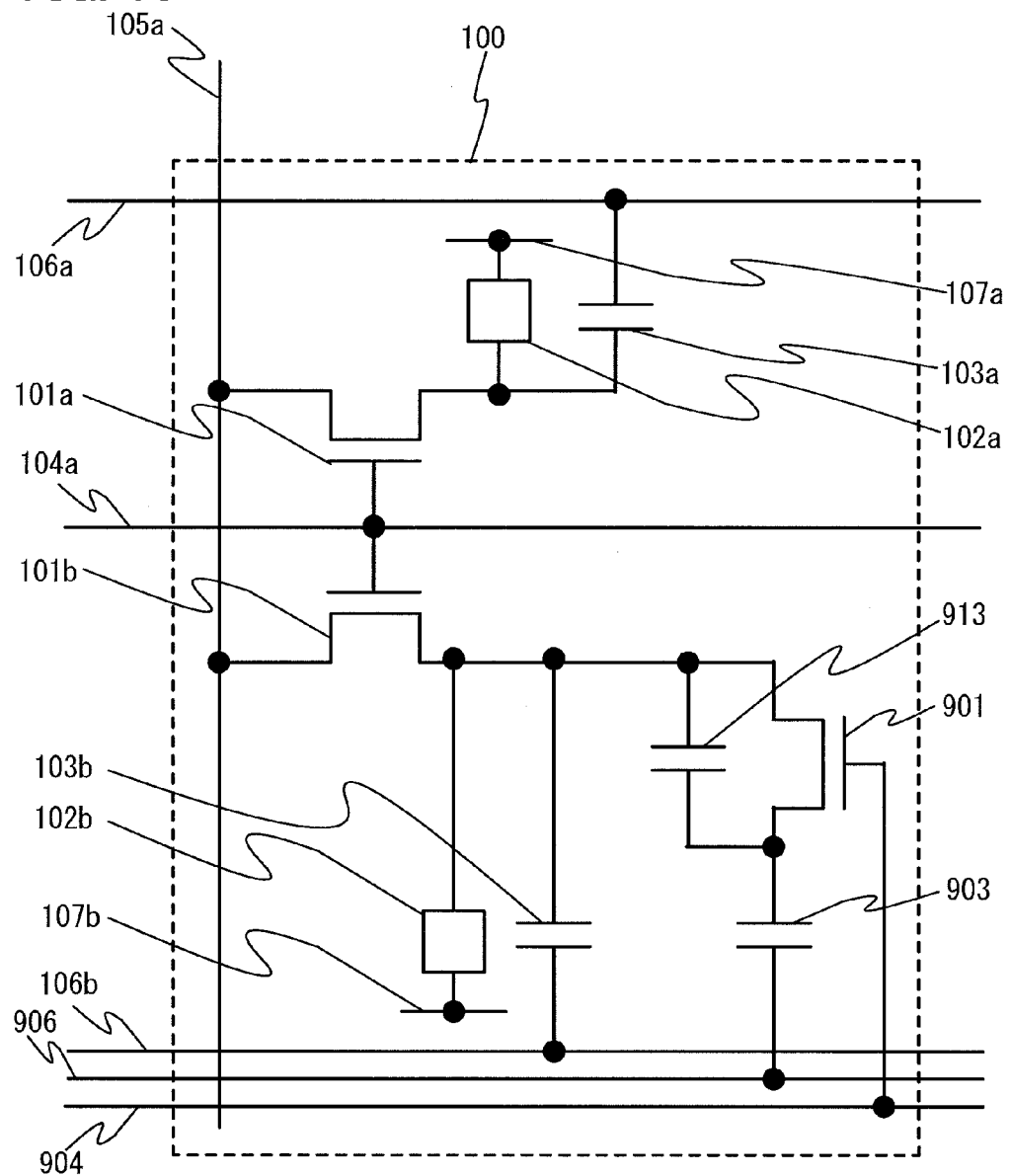
FIG. 16 is a circuit diagram illustrating a semiconductor device.

Note that a capacitor 913 can be connected to the first terminal of the capacitor 903 or the second terminal of the transistor 901. For example, the capacitor 913 is added to the pixel 100 in FIG. 14 as illustrated in FIG. 16, and a first terminal of the capacitor 913 is connected to the first terminal of the capacitor 903 or the second terminal of the transistor 901. A second terminal of the capacitor 913 is connected to the second terminal of the transistor 101*b*.

With such provision of the capacitor 913, the level of voltage applied to the capacitor 903 can be adjusted.

For example, the area or capacitance value of the capacitor 913 is preferably smaller than that of the capacitor 903 because the level of voltage applied to the capacitor 903 can be lowered. Thus, the level of the voltage of the display element 102*b* can be changed effectively. Note that one aspect of one embodiment of the present invention is not limited to this.

Figure 17:
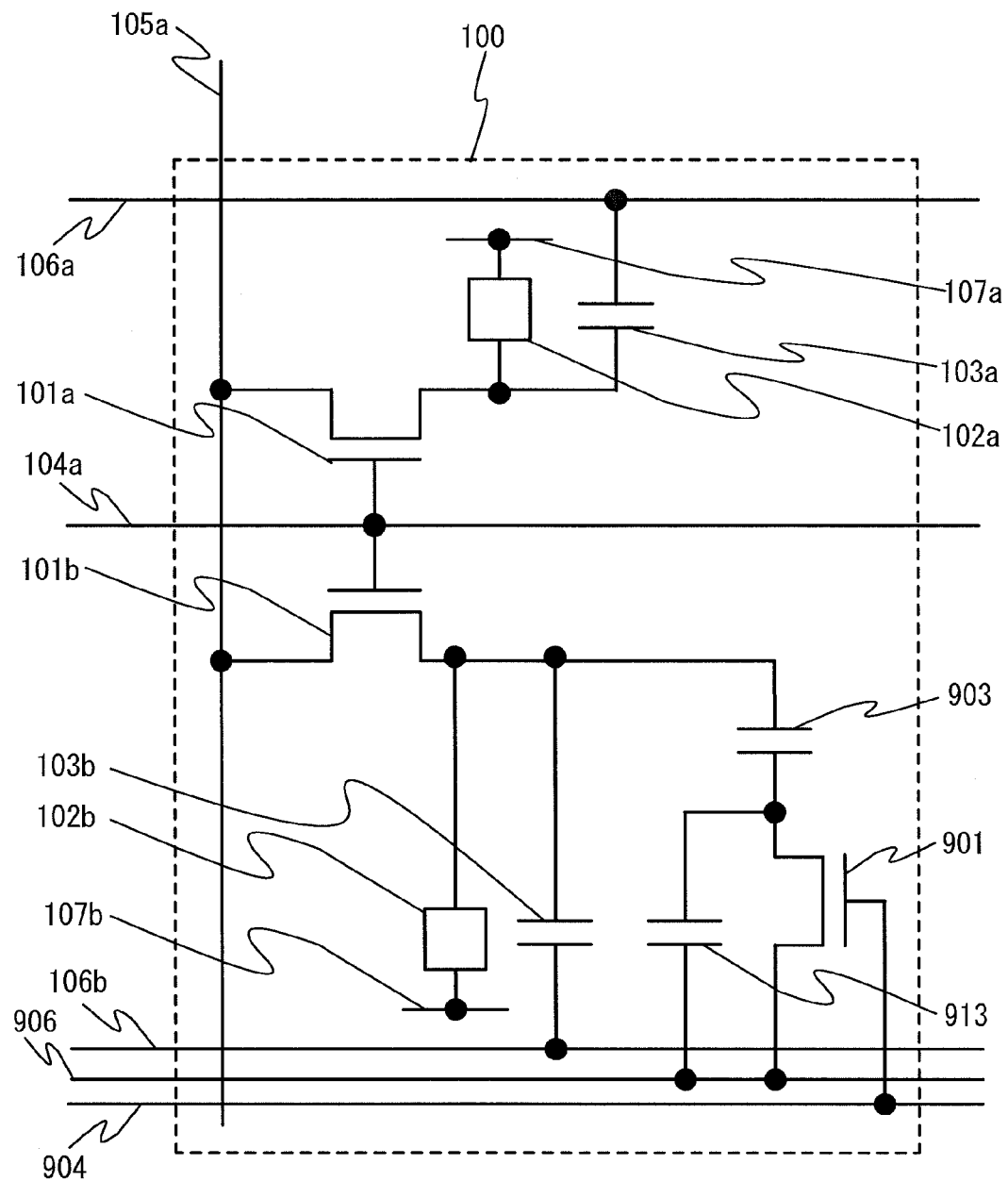
FIG. 17 is a circuit diagram illustrating a semiconductor device.

Note that FIG. 17 illustrates the case where the capacitor 913 is added to the pixel 100 illustrated in FIG. 15. The second terminal of the capacitor 913 is connected to the wiring 906. The second terminal of the capacitor 913 can be connected to the wiring 106*a* or the wiring 106*b*.

Figure 18:
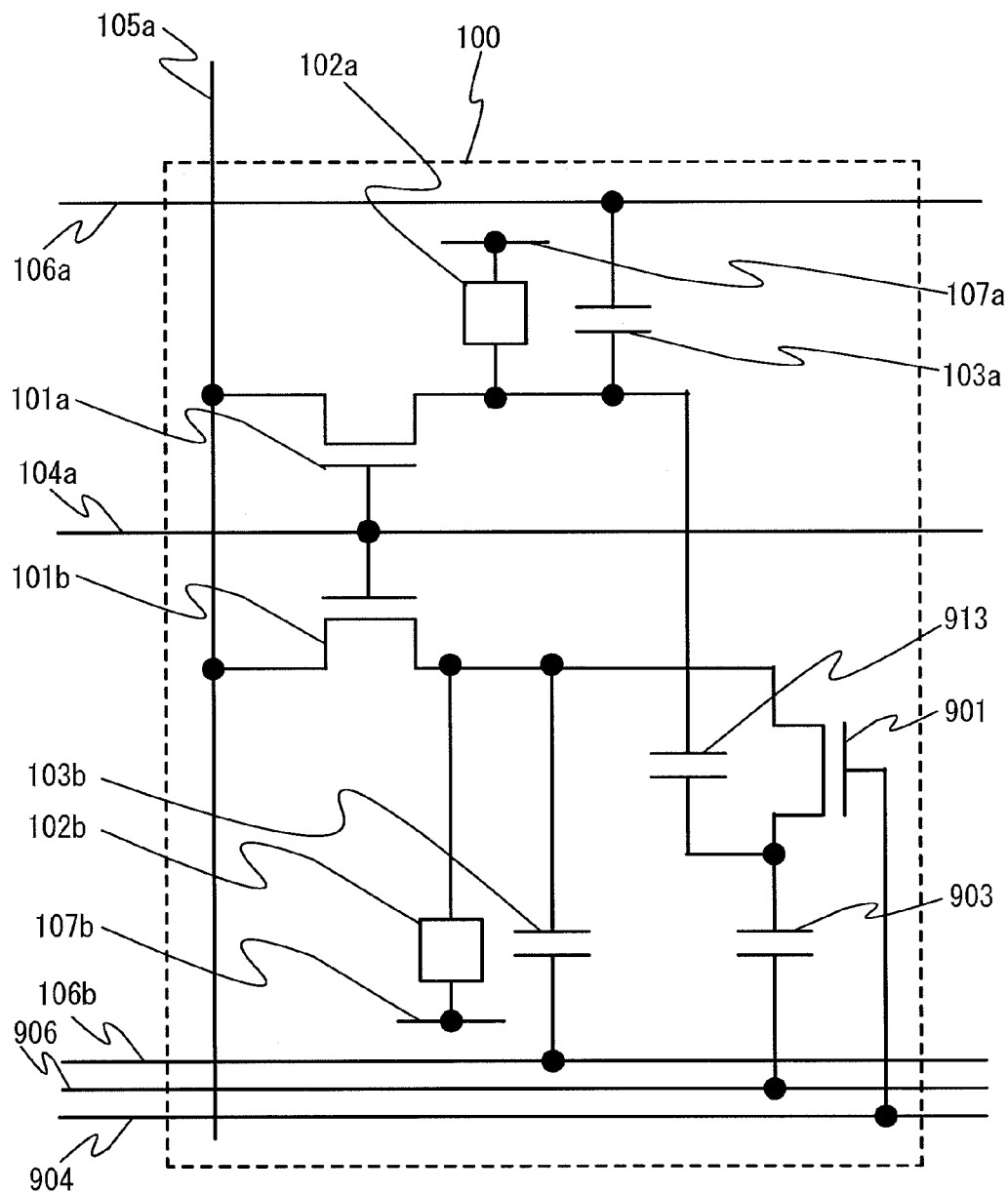
FIG. 18 is a circuit diagram illustrating a semiconductor device.
Figure 19:
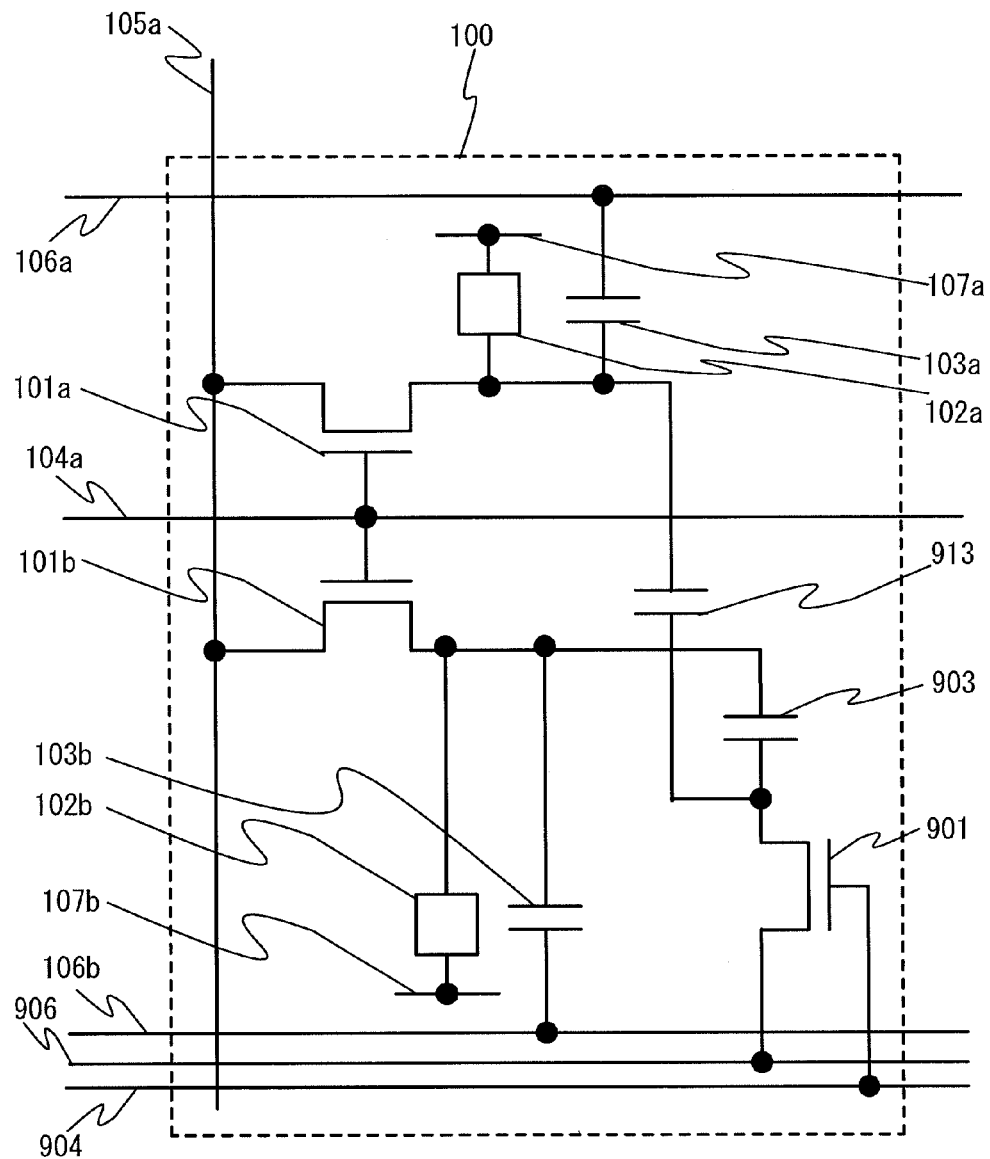
FIG. 19 is a circuit diagram illustrating a semiconductor device.

Note that the second terminal of the capacitor 913 can be connected to a variety of elements. For example, FIG. 18 illustrates an example where the second terminal of the capacitor 913 is connected to the second terminal of the transistor 101a in the pixel 100 illustrated in FIG. 16. Similarly, FIG. 19 illustrates an example where the second terminal of the capacitor 913 is connected to the second terminal of the transistor 101a in the pixel 100 illustrated in FIG. 17.

Figure 20:
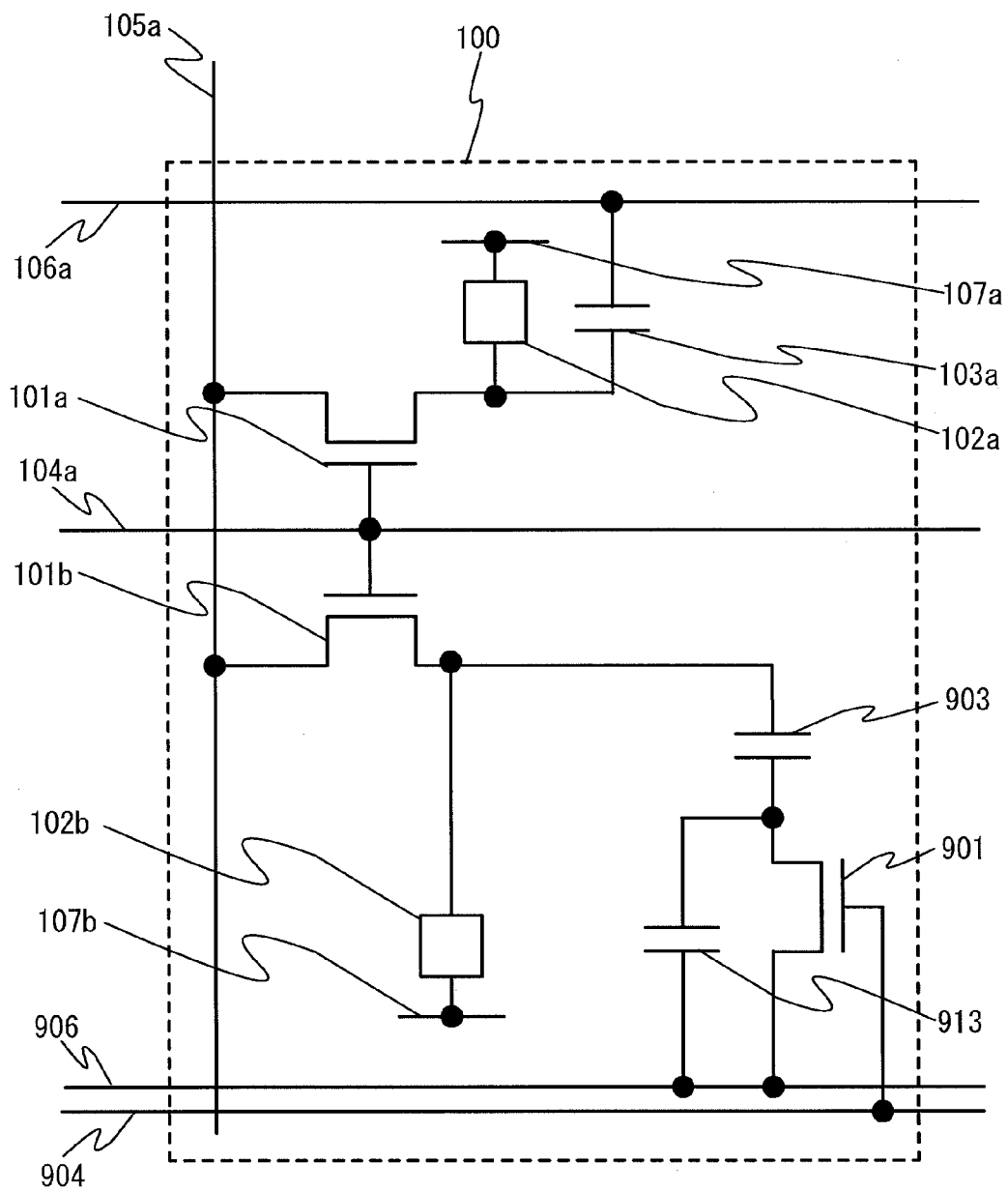
FIG. 20 is a circuit diagram illustrating a semiconductor device.

Note that the capacitor 103a or the capacitor 103b can be eliminated. For example, FIG. 20 illustrates an example where the capacitor 103b is not provided in the pixel 100 illustrated in FIG. 17.

Note that although the pixels 100 illustrated in FIG. 14, FIG. 15, FIG. 16, FIG. 17, FIG. 18, FIG. 19, and FIG. 20 each include two subpixels, one aspect of one embodiment of the present invention is not limited to this. The number of subpixels can be three or more.

Figure 21:
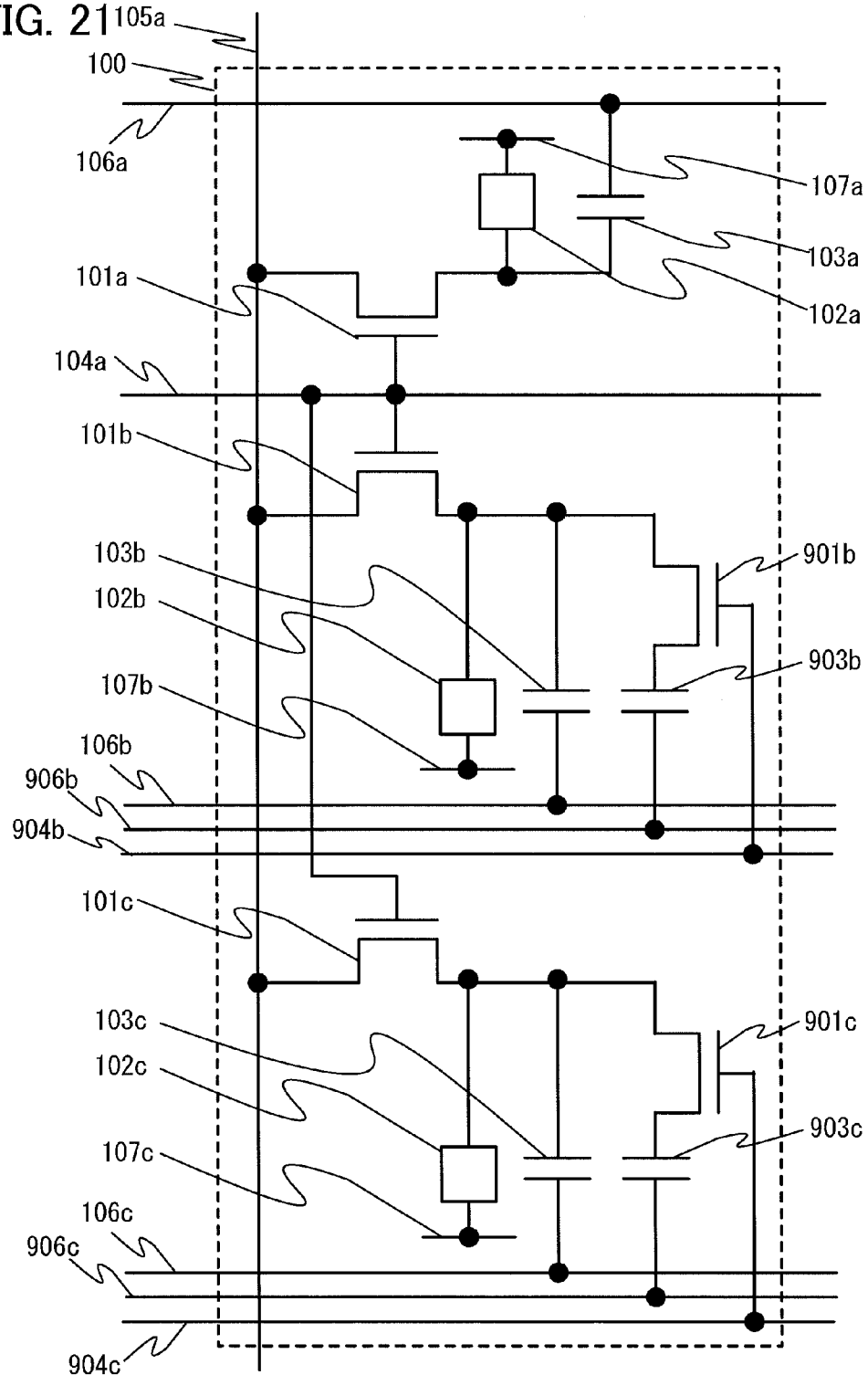
FIG. 21 is a circuit diagram illustrating a semiconductor device.

For example, FIG. 21 illustrates an example in which the pixel 100 illustrated in FIG. 14 includes three subpixels. In FIG. 21, the gate of the transistor 101c is connected to the wiring 104a. The first terminal of the transistor 101c is connected to the wiring 105a. The second terminal of the transistor 101c is connected to the first terminal of the display element 102b. The first terminal of the display element 102c is connected to the first terminal of the capacitor 103c, and the second terminal of the capacitor 103c is connected to the wiring 106c. A gate of the transistor 901c is connected to a wiring 904c. A first terminal of the transistor 901c is connected to the first terminal of the display element 102c. A second terminal of the transistor 901c is connected to a first terminal of the capacitor 903c. A second terminal of the capacitor 903c is connected to a wiring 906c.

Note that the transistor 901, the capacitor 903, the wiring 906, and the wiring 904 in FIG. 14 correspond to the transistor 901b, the capacitor 903b, the wiring 906b, and the wiring 904b in FIG. 21, respectively.

For example, the area or capacitance value of the capacitor 903b is preferably different from that of the capacitor 903c. Alternatively, the area or capacitance value of the capacitor 103b is preferably different from that of the capacitor 103c. Alternatively, the area or capacitance value of the display element 102b is preferably different from that of the display element 102c. With such a structure, in a plurality of subpixels, display elements can have voltages whose levels are different from each other as appropriate. Note that one aspect of one embodiment of the present invention is not limited to this.

Figure 22:
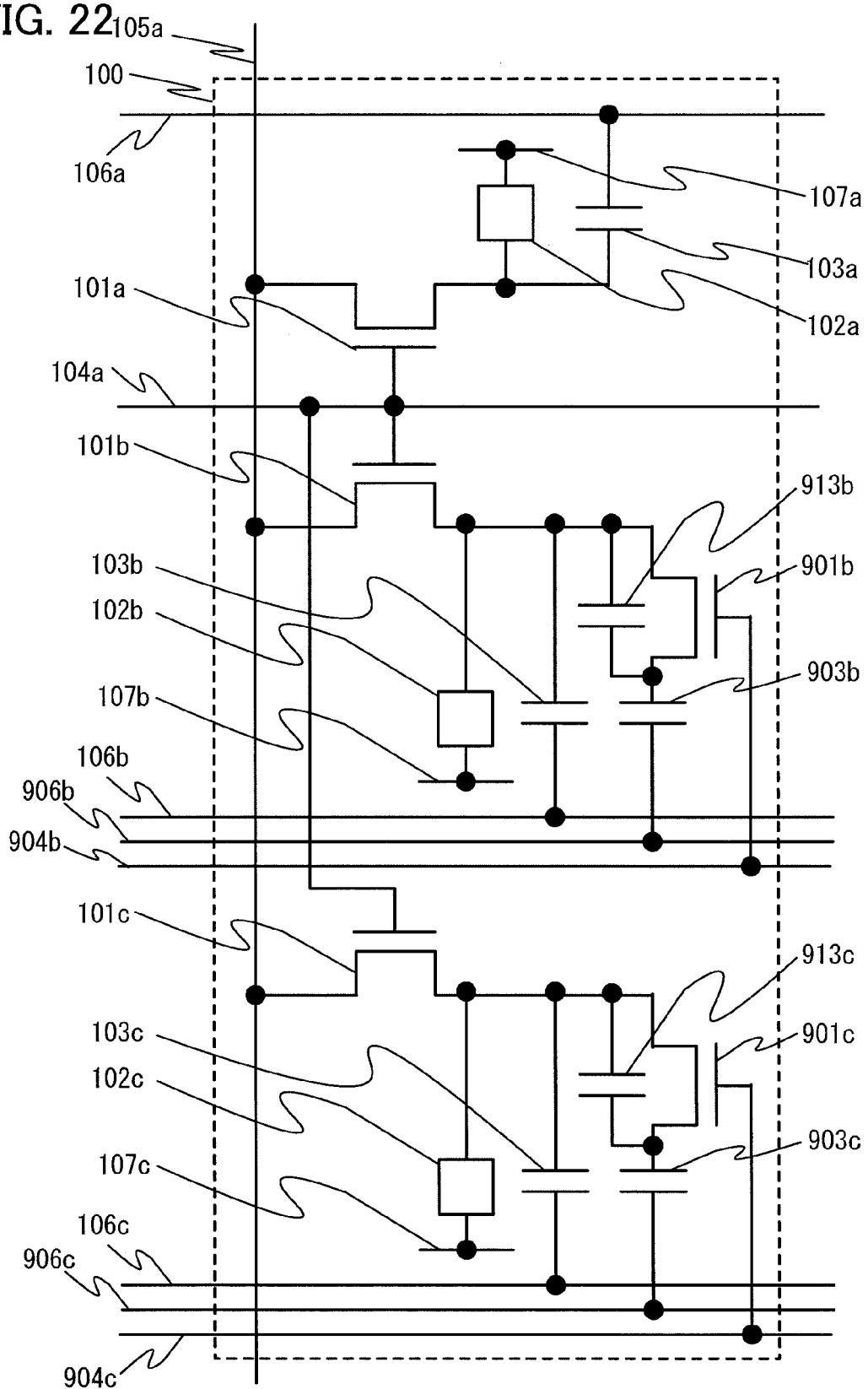
FIG. 22 is a circuit diagram illustrating a semiconductor device.

FIG. 22 illustrates an example where a capacitor 913b and a capacitor 913c are added to the pixel 100 illustrated in FIG. 21, as in the example where the pixel 100 illustrated in FIG. 14 is transformed into the pixel 100 illustrated in FIG. 16. The capacitor 913b is provided between a first terminal and a second terminal of the transistor 901b. The capacitor 913c is provided between the first terminal and the second terminal of the transistor 901c.

Note that also in the case where three or more subpixels are provided, a certain wiring and a different wiring are put together into one wiring so that the number of wirings can be reduced. Thus, the aperture ratio can be improved.

The off-state current of a transistor including an oxide semiconductor is low; thus, defects caused by off-state current can be reduced when a semiconductor device or the like including an oxide semiconductor is used. Thus, images can be displayed more accurately.

A thin film transistor including an intrinsic (i-type) oxide semiconductor layer as an active layer is particularly preferable because the off-state current of the thin film transistor is low. As a method for making an oxide semiconductor layer intrinsic (i-type), dehydration or dehydrogenation is effective.

Embodiment 5

In this embodiment, an example of a transistor including an oxide semiconductor layer that can be used for any of the display devices described in Embodiments 1 to 4, and an example of the formation method of the transistor are described in detail with reference to FIG. 23 and FIGS. 24A to 24E. Note that the same portions as or portions having functions similar to those in the above embodiment can be formed in a manner similar to that described in the above embodiment, steps similar to those in the above embodiment can be performed in a manner similar to that described in the above embodiment, and description thereof is omitted. In addition, detailed description of the same portions is not repeated.

Note that in this specification and the like, when it is explicitly described that "Y is formed on X" or "Y is formed over X", it does not necessarily mean that Y is formed in direct contact with X. The description includes the case where X and Y are not in direct contact with each other, i.e., the case where another object is provided between X and Y. Here, each of X and Y is an object (e.g., a device, an element, a circuit, a wiring, an electrode, a terminal, a conductive film, or a layer).

Therefore, for example, when it is explicitly described that "a layer Y is formed on (or over) a layer X", it includes both the case where the layer Y is formed on and in direct contact with the layer X and the case where another layer (e.g., a layer Z) is formed on and in direct contact with the layer X and the layer Y is formed on and in direct contact with the layer Z. Note that another layer (e.g., a layer Z) may be a single layer or a plurality of layers (a stack of layers).

Similarly, when it is explicitly described that "Y is formed above X", it does not necessarily mean that Y is formed on and in direct contact with X and another object may be provided therebetween. Therefore, for example, when it is described that "a layer Y is formed above a layer X", it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., a layer Z) may be a single layer or a plurality of layers (a stack of layers).

Note that when it is explicitly described that "Y is formed on X", "Y is formed over X", or "Y is formed above X", it includes the case where Y is formed obliquely over/above X.

<Structure Example of Transistor>

Figure 23:
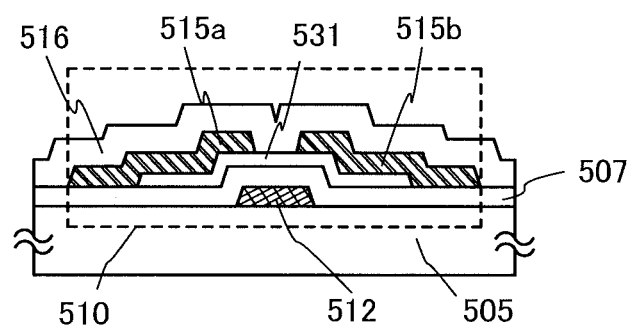
FIG. 23 is a cross-sectional view illustrating a semiconductor device.

As a transistor including an oxide semiconductor layer that can be used for any of the display devices described in Embodiments 1 to 4, for example, a top-gate transistor, a bottom-gate transistor, or the like can be used. Alternatively, the transistor may have a single-gate structure including one channel formation region, a double-gate structure including two channel formation regions, or a triple-gate structure including three channel formation regions. Alternatively, the transistor may have a dual-gate structure including two gate electrode layers provided over and below a channel region with a gate insulating layer provided therebetween. FIG. 23 illustrates a bottom-gate transistor as an example of the transistor including an oxide semiconductor layer.

A transistor 510 includes a gate electrode layer 512 over a substrate 505, a gate insulating layer 507 over the gate electrode layer 512, and an island-shaped oxide semiconductor layer 531 overlapping with the gate electrode layer 512 with the gate insulating layer 507 provided therebetween. Further, a source and drain electrode layers 515a and 515b are provided in contact with the island-shaped oxide semiconductor layer 531. Furthermore, a channel is formed in the island-shaped oxide semiconductor layer 531 overlapping with the gate electrode layer 512 between regions with which the source and drain electrode layers 515a and 515b are in contact.

<Example of Steps of Forming Transistor>

FIGS. 24A to 24E illustrate an example of the cross-sectional structure of a transistor. The transistor 510 illustrated in FIGS. 24A to 24E is an inverted staggered transistor with a bottom-gate structure that is similar to the transistor 510 illustrated in FIG. 23.

Steps of forming the transistor 510 over the substrate 505 are described below with reference to FIGS. 24A to 24E.

First, a conductive film is formed over the substrate 505 having an insulating surface. Then, a wiring layer including a gate electrode layer 521 is formed through a first photolithography process. Note that a resist may be formed by an inkjet method. When the resist is formed by an inkjet method, a photomask is not used; thus, manufacturing cost can be reduced.

In this embodiment, a glass substrate is used as the substrate 505 having an insulating surface.

An insulating film which serves as a base film may be provided between the substrate 505 and the gate electrode layer 521. The base film has a function of preventing diffusion of an impurity element (e.g., an alkali metal such as Li or Na, or an alkaline earth metal such as Ca) from the substrate 505, and can be formed to have a single-layer structure or a layered structure using one or more films selected from a silicon nitride film, a silicon oxide film, a silicon nitride oxide film, and a silicon oxynitride film.

The gate electrode layer 521 can be formed to have a single-layer structure or a layered structure using a metal material such as molybdenum, titanium, tantalum, tungsten, aluminum, copper, neodymium, or scandium, or an alloy material which includes any of these as a main component.

Next, a gate insulating layer 507 is formed over the gate electrode layer 521. The gate insulating layer 507 can be formed to have a single-layer structure or a layered structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by plasma-enhanced CVD, sputtering, or the like.

An oxide semiconductor which is made to be an intrinsic (i-type) or substantially intrinsic semiconductor by removal of impurities is used as an oxide semiconductor in this embodiment. Such a highly purified oxide semiconductor is highly sensitive to interface state density and interface charge; thus, an interface between the oxide semiconductor layer and the gate insulating layer is important. Thus, the gate insulating layer which is in contact with the highly purified oxide semiconductor needs high quality.

For example, high-density plasma-enhanced CVD using microwaves (e.g., a frequency of 2.45 GHz) is preferable because a dense high-quality insulating layer with high withstand voltage can be formed. This is because the interface state density can be reduced and interface properties can be favorable when the highly purified oxide semiconductor is closely in contact with the high-quality gate insulating layer.

Needless to say, a different deposition method can be used as long as a high-quality insulating layer can be formed as the gate insulating layer. In addition, any gate insulating layer can be used as long as film quality and properties of an interface with an oxide semiconductor of the gate insulating layer are modified by heat treatment performed after deposition. In either case, any gate insulating layer can be used as long as film quality as a gate insulating layer is high, interface state density with an oxide semiconductor is decreased, and a favorable interface can be formed.

Note that in order that hydrogen, a hydroxyl group, and moisture are contained in the gate insulating layer 507 and an oxide semiconductor film 530 as little as possible, it is preferable that as pretreatment for the deposition of the oxide semiconductor film 530, the substrate 505 over which the gate electrode layer 521 or the gate insulating layer 507 is formed be preheated in a preheating chamber of a sputtering apparatus, so that impurities such as hydrogen and moisture adsorbed onto the substrate 505 are eliminated and exhausted. As an exhaustion means provided in the preheating chamber, a cryopump is preferable. Note that this preheating treatment can be omitted. In addition, the preheating may be similarly performed on the substrate 505 over which the source and drain electrode layers 515a and 515b are formed before the deposition of an insulating layer 516.

Figure 24A:
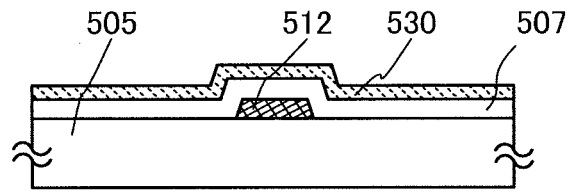
FIGS. 24A to 24E illustrate steps of manufacturing a semiconductor device.
Figure 24B:
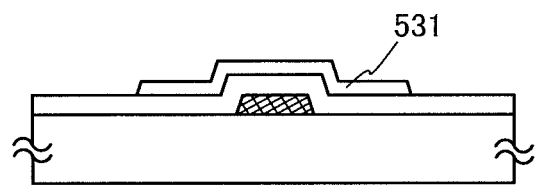
Figure 24C:
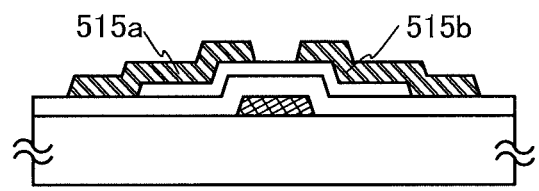

Next, the oxide semiconductor film 530 with a thickness of 2 to 200 nm, preferably 5 to 30 nm is formed over the gate insulating layer 507 (see FIG. 24A).

Note that before the oxide semiconductor film 530 is deposited by sputtering, powdery substances (also referred to as particles or dust) which attach to a surface of the gate insulating layer 507 are preferably removed by reverse sputtering in which an argon gas is introduced and plasma is generated. The reverse sputtering is a method in which, without application of voltage to a target side, an RF power source is used for application of voltage to a substrate in an argon atmosphere and plasma is generated in the vicinity of the substrate so that a substrate surface is modified. Note that nitrogen, helium, oxygen, or the like may be used instead of the argon atmosphere.

As an oxide semiconductor used for the oxide semiconductor film 530, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; or the like can be used. Further, the oxide semiconductor layer may contain silicon oxide. When silicon oxide ($SiO_x$ (x>0)), which hinders crystallization, is contained in the oxide semiconductor layer, crystallization of the oxide semiconductor layer can be suppressed in the case where heat treatment is performed after the oxide semiconductor film is formed in the manufacturing process. Here, for example, an In—Ga—Zn—O-based oxide semiconductor means an oxide film containing indium (In), gallium (Ga), and zinc (Zn), and there is no particular limitation on the composition ratio. Further, the In—Ga—Zn—O-based oxide semiconductor may contain an element other than In, Ga, and Zn. In the case where an In—Zn—O-based material is used for the oxide semiconductor, a target used has a composition ratio of In:Zn=50:1 to 1:2 in an atomic ratio (In$_2$O$_3$:ZnO=25:1 to 1:4 in a molar ratio), preferably In:Zn=20:1 to 1:1 in an atomic ratio (In$_2$O$_3$:ZnO=10:1 to 1:2 in a molar ratio), more preferably In:Zn=15:1 to 1.5:1 (In$_2$O$_3$:ZnO=15:2 to 3:4 in a molar ratio). For example, when a target used for the deposition of the In—Zn—O-based oxide semiconductor has a composition ratio of In:Zn:O=X:Y:Z in an atomic ratio, where Z>1.5X+Y.

The oxide semiconductor is preferably an oxide semiconductor containing In, more preferably, an oxide semiconductor containing In and Ga. Dehydration or dehydrogenation is effective in obtaining an i-type (intrinsic) oxide semiconductor layer. In this embodiment, the oxide semiconductor film 530 is deposited by sputtering with the use of an In—Ga—Zn—O-based oxide semiconductor target. A cross-sectional view at this stage corresponds to FIG. 24A.

As a target used for the deposition of the oxide semiconductor film 530 by sputtering, for example, an oxide target containing In$_2$O$_3$, Ga$_2$O$_3$, and ZnO at a composition ratio of 1:1:1 [molar ratio] is used, so that an In—Ga—Zn—O film is deposited. Without limitation on the material and the composition of the target, for example, an oxide target containing In$_2$O$_3$, Ga$_2$O$_3$, and ZnO at a composition ratio of 1:1:2 or 1:1:4 [molar ratio] may be used.

The filling rate of the oxide target is 90 to 100%, preferably 95 to 99.9%. With the use of a metal oxide target with a high filling rate, a dense oxide semiconductor film can be deposited. Further, the purity of the target is preferably 99.99% or higher. In particular, it is preferable that impurities, for example, an alkali metal such as Li or Na and an alkaline earth metal such as Ca be reduced.

It is preferable that a high-purity gas from which impurities such as hydrogen, water, a hydroxyl group, and hydride are removed be used as a sputtering gas used for the deposition of the oxide semiconductor film 530.

The substrate is placed in a deposition chamber kept under reduced pressure, and the substrate temperature is 100 to 600° C., preferably 200 to 400° C. By deposition of the oxide semiconductor film while the substrate is heated, the concentration of impurities included in the deposited oxide semiconductor film can be lowered. In addition, damage by sputtering is reduced. Then, a sputtering gas from which hydrogen and moisture are removed is introduced while moisture remaining in the deposition chamber is removed using an exhaustion pump, and the oxide semiconductor film 530 is deposited over the substrate 505 with the use of the target. In order to remove moisture remaining in the deposition chamber and hydrogen and moisture that enter from the outside of the deposition chamber (hydrogen and moisture that enter due to leakage), an adsorption vacuum pump such as a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the deposition chamber with the use of a cryopump. Thus, the concentration of impurities contained in the oxide semiconductor film deposited in the deposition chamber can be lowered.

The atmosphere for the sputtering may be a rare gas (typically argon) atmosphere, an oxygen atmosphere, or a mixed atmosphere containing a rare gas and oxygen.

An example of the deposition condition is as follows: the distance between the substrate and the target is 100 mm, the pressure is 0.6 Pa, the DC power is 0.5 kW, and the atmosphere is an oxygen atmosphere (the proportion of the oxygen flow rate is 100%). Note that a pulsed DC power source is preferably used because powdery substances (also referred to as particles or dust) generated in the deposition can be reduced and the film thickness can be uniform.

Further, when the leakage rate of the deposition chamber of the sputtering apparatus is set lower than or equal to $1\times10^{-10}$ Pa·m$^3$/s, entry of impurities such as an alkali metal and hydride to the oxide semiconductor film that is being deposited by sputtering can be reduced.

Further, with the use of an adsorption vacuum pump as an exhaustion system, counter flow of impurities such as an alkali metal, a hydrogen atom, a hydrogen molecule, water, a hydroxyl group, and hydride from the exhaustion system can be reduced.

Note that impurities, for example, an alkali metal such as Li or Na and an alkaline earth metal such as Ca contained in the oxide semiconductor layer are preferably reduced. Specifically, the impurity concentrations of Li, Na, and K contained in the oxide semiconductor layer are each $5\times10^{15}$ cm$^{-3}$ or lower, preferably $1\times10^{15}$ cm$^{-3}$ when the concentrations are measured by SIMS.

An alkali metal and an alkaline earth metal are bad impurities for the oxide semiconductor and are contained as little as possible. When an insulating film that is in contact with the oxide semiconductor is an oxide, an alkali metal, in particular, Na diffuses into the oxide and becomes Na$^+$. In addition, Na cuts a bond between metal and oxygen or enters the bond in the oxide semiconductor. Consequently, transistor characteristics deteriorate (for example, the transistor becomes normally-on (the threshold voltage is shifted to a negative side) or mobility is decreased). Further, this also causes variation in the characteristics. Such a problem becomes evident especially in the case where the hydrogen concentration in the oxide semiconductor is extremely low. The concentration of an alkali metal is therefore strongly required to set the above value in the case where the hydrogen concentration in the oxide semiconductor is $5\times10^{19}$ cm$^{-3}$ or lower, particularly $5\times10^{18}$ cm$^{-3}$ or lower.

Next, the oxide semiconductor film 530 is processed into an island-shaped oxide semiconductor layer through a second photolithography process. A resist used for forming the island-shaped oxide semiconductor layer may be formed by an inkjet method. When the resist is formed by an inkjet method, a photomask is not used; thus, manufacturing cost can be reduced.

In the case where a contact hole is formed in the gate insulating layer 507, the formation of the contact hole can be performed at the same time as processing of the oxide semiconductor film 530.

Note that as the etching of the oxide semiconductor film 530, dry etching, wet etching, or both dry etching and wet etching may be employed. As an etchant used for wet etching of the oxide semiconductor film 530, for example, a solution obtained by mixture of phosphoric acid, acetic acid, and nitric acid, or the like can be used. Alternatively, ITO-07N (produced by KANTO CHEMICAL CO., INC.) may be used.

In this embodiment, the oxide semiconductor layer is subjected to first heat treatment. Through the first heat treatment, the oxide semiconductor layer can be dehydrated or dehydrogenated. The temperature of the first heat treatment is higher than or equal to 400° C. and lower than or equal to 750° C., or higher than or equal to 400° C. and lower than the strain point of the substrate. Here, after the substrate is put in an electric furnace that is a kind of heat treatment apparatus and the oxide semiconductor layer is subjected to heat treatment at 450° C. for one hour in a nitrogen atmosphere, water or hydrogen is prevented from being mixed into the oxide semiconductor layer without exposure to the air; thus, the oxide semiconductor layer 531 is obtained (see FIG. 24B).

The heat treatment apparatus is not limited to an electric furnace, and a device for heating an object to be processed by thermal conduction or thermal radiation from a heater such as a resistance heater may be used. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the high-temperature gas, an inert gas which does not react with an object to be processed by heat treatment, such as nitrogen or a rare gas (e.g., argon), is used.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature.

Note that in the first heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

After the oxide semiconductor layer is heated in the first heat treatment, a high-purity oxygen gas, a high-purity $N_2O$ gas, or ultra-dry air (having a dew point of −40° C. or lower, preferably −60° C. or lower) may be introduced into the same furnace while the heating temperature is maintained or decreased. It is preferable that water, hydrogen, and the like be not contained in the oxygen gas or the $N_2O$ gas. Alternatively, the purity of the oxygen gas or the $N_2O$ gas which is introduced into the heat treatment apparatus is preferably 6N (99.9999%) or higher, more preferably 7N (99.99999%) or higher (that is, the impurity concentration in the oxygen gas or the $N_2O$ gas is 1 ppm or lower, preferably 0.1 ppm or lower). By the action of the oxygen gas or the $N_2O$ gas, oxygen which is a main component of the oxide semiconductor and which is reduced at the same time as the step of removing impurities by dehydration or dehydrogenation is supplied, so that the oxide semiconductor layer can be a highly purified electrically i-type (intrinsic) oxide semiconductor layer.

In addition, the first heat treatment for the oxide semiconductor layer can be performed before the oxide semiconductor film 530 is processed into the island-shaped oxide semiconductor layer. In that case, the substrate is taken out of the heat treatment apparatus after the first heat treatment, and then a photolithography process is performed.

Note that other than the above timing, the first heat treatment may be performed at either of the following timings as long as it is performed after the oxide semiconductor layer is deposited: after a source electrode layer and a drain electrode layer are formed over the oxide semiconductor layer; and after an insulating layer is formed over the source electrode layer and the drain electrode layer.

Further, in the case where a contact hole is formed in the gate insulating layer 507, the formation of the contact hole may be performed before or after the first heat treatment is performed on the oxide semiconductor film 530.

In addition, as the oxide semiconductor layer, an oxide semiconductor layer having a crystal region with a large thickness, that is, a crystal region which is c-axis-aligned perpendicularly to a surface of the film may be formed by performing deposition twice and heat treatment twice, regardless of the material of a base member, such as an oxide, a nitride, or a metal. For example, after a first oxide semiconductor film with a thickness of 3 to 15 nm is deposited, first heat treatment is performed at 450 to 850° C., preferably 550 to 750° C. in the atmosphere of nitrogen, oxygen, a rare gas, or dry air, so that a first oxide semiconductor film which includes a crystalline region (including plate-like crystals) in a region including its surface is formed. Then, after a second oxide semiconductor film which has a larger thickness than the first oxide semiconductor film is formed, second heat treatment is performed at 450 to 850° C., preferably 600 to 700° C., so that crystal growth proceeds upward with the use of the first oxide semiconductor film as a seed of the crystal growth and the entire second oxide semiconductor film is crystallized. In such a manner, the oxide semiconductor layer having a thick crystal region may be formed.

Next, a conductive film serving as the source electrode layer and the drain electrode layer (including a wiring formed using the same layer as the source electrode layer and the drain electrode layer) is formed over the gate insulating layer 507 and the oxide semiconductor layer 531. As the conductive film serving as the source electrode layer and the drain electrode layer, for example, a metal film including an element selected from Al, Cr, Cu, Ta, Ti, Mo, or W, a metal nitride film including the above element as its component (e.g., a titanium nitride film, a molybdenum nitride film, or a tungsten nitride film), or the like can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film of Al, Cu, or the like. In particular, it is preferable to provide a conductive film containing titanium on a side in contact with the oxide semiconductor layer.

A resist is formed over the conductive film through a third photolithography process, and the source and drain electrode layers 515a and 515b are Ruined by selective etching. Then, the resist is removed (see FIG. 24C).

An ultraviolet ray, a KrF laser beam, or an ArF laser beam may be used for exposure at the time of formation of the resist mask through the third photolithography process. The channel length L of a transistor to be formed later is determined by a pitch between a lower end of the source electrode layer and a lower end of the drain electrode layer that are adjacent to each other over the oxide semiconductor layer 531. Note that when exposure is performed under a condition that the channel length L is less than 25 nm, the exposure at the time of the formation of the resist through the third photolithography process is preferably performed using an extreme ultraviolet ray whose wavelength is extremely short (several nanometers to several tens of nanometers). In exposure with an extreme ultraviolet ray, resolution is high and the depth of focus is large. Therefore, the channel length L of the transistor to be formed later can be 10 to 1000 nm, and a circuit can operate at higher speed.

In order to reduce the number of photomasks used in the photolithography processes and the number of processes, an etching process may be performed using a resist formed using a multi-tone mask that is an exposure mask through which light is transmitted to have a plurality of intensities. A resist formed using a multi-tone mask has a plurality of thicknesses and can be changed in shape by etching; therefore, the resist can be used in a plurality of etching processes for processing films into different patterns. Therefore, a resist corresponding to at least two or more kinds of different patterns can be formed by one multi-tone mask. Thus, the number of exposure masks and the number of corresponding photolithography processes can be reduced, so that the process can be simplified.

Note that it is preferable that etching conditions be optimized so that the oxide semiconductor layer 531 is not etched and divided when the conductive film is etched. However, it is difficult to obtain etching conditions in which only the conductive film is etched and the oxide semiconductor layer 531 is not etched at all. In some cases, only part of the oxide semiconductor layer 531 is etched to be an oxide semiconductor layer having a groove (a depression) when the conductive film is etched.

In this embodiment, a Ti film is used as the conductive film and an In—Ga—Zn—O-based oxide semiconductor is used for the oxide semiconductor layer 531; thus, an ammonia hydrogen peroxide solution (a mixed solution of ammonia, water, and a hydrogen peroxide solution) is used as an etchant, so that the conductive film can be selectively etched.

Next, water or the like adsorbed onto an exposed surface of the oxide semiconductor layer may be removed by plasma treatment using a gas such as $N_2O$, $N_2$, or Ar. In the case where the plasma treatment is performed, the insulating layer 516 serving as a protective insulating film that is in contact with part of the oxide semiconductor layer is formed without exposure to the air.

The insulating layer 516 can be formed to a thickness of at least 1 nm or more by a method by which impurities such as water and hydrogen are not mixed into the insulating layer 516, such as sputtering, as appropriate. When hydrogen is contained in the insulating layer 516, entry of hydrogen to the oxide semiconductor layer or extraction of oxygen contained in the oxide semiconductor layer by hydrogen is caused; thus, a backchannel of the oxide semiconductor layer might have low resistance (n-type conductivity) and a parasitic channel might be formed. It is therefore important to employ a deposition method in which hydrogen is not used in order to form the insulating layer 516 containing hydrogen as little as possible.

In this embodiment, a 200-nm-thick silicon oxide film is deposited as the insulating layer 516 by sputtering. The substrate temperature at the time of deposition is in the range of from room temperature to 300° C., and 100° C. in this embodiment. The silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, a silicon oxide film can be deposited using a silicon target in an atmosphere including oxygen by sputtering. The insulating layer 516 which is formed in contact with the oxide semiconductor layer is formed using an inorganic insulating film which does not include impurities such as moisture, a hydrogen ion, and OH$^-$ and blocks entry of these impurities from the outside. Typically, the insulating layer 516 is formed using a silicon oxide film, a silicon oxynitride film, an aluminum oxide film, an aluminum oxynitride film, or the like.

In order to remove moisture remaining in the deposition chamber of the insulating layer 516 in a manner similar to that of the deposition of the oxide semiconductor film 530, an adsorption vacuum pump (e.g., a cryopump) is preferably used. When the insulating layer 516 is deposited in the deposition chamber which is exhausted using a cryopump, the impurity concentration in the insulating layer 516 can be lowered. In addition, as an exhaustion means for removing moisture remaining in the deposition chamber used for depositing the insulating layer 516, a turbo pump to which a cold trap is added may be used.

It is preferable that a high-purity gas from which impurities such as hydrogen, water, a hydroxyl group, and hydride are removed be used as a sputtering gas used for the deposition of the insulating layer 516.

Next, second heat treatment (preferably at 200 to 400° C., for example, 250 to 350° C.) is performed in an inert gas atmosphere or an oxygen gas atmosphere. For example, the second heat treatment is performed at 250° C. for one hour in a nitrogen atmosphere. Through the second heat treatment, part (a channel formation region) of the oxide semiconductor layer is heated while being in contact with the insulating layer 516.

As described above, the first heat treatment is performed on the oxide semiconductor film so that impurities such as hydrogen, moisture, a hydroxyl group, and hydride (also referred to as a hydrogen compound) are intentionally removed from the oxide semiconductor layer, and then oxygen which is one of main components of the oxide semiconductor and is reduced at the same time as the step of removing impurities can be supplied. The oxide semiconductor layer is therefore a highly purified electrically i-type (intrinsic) oxide semiconductor layer.

Figure 24D:
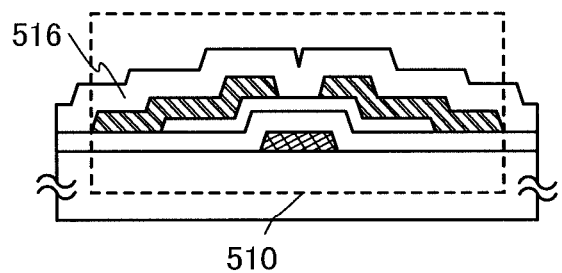
Figure 24E:
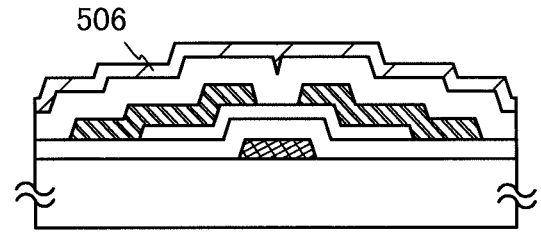

Through the steps, the transistor 510 is formed (see FIG. 24D).

When a silicon oxide layer having a lot of defects is used as the insulating layer 516, impurities such as hydrogen, moisture, a hydroxyl group, and hydride contained in the oxide semiconductor layer are diffused in the silicon oxide layer by heat treatment performed after the formation of the silicon oxide layer, so that the impurities contained in the oxide semiconductor layer can be further reduced.

In addition, when a silicon oxide layer containing excessive oxygen is used as the insulating layer 516, oxygen in the insulating layer 516 is moved to the oxide semiconductor layer 531 by heat treatment performed after the formation of the insulating layer 516, so that the oxygen concentration in the oxide semiconductor layer 531 can be improved and the oxide semiconductor layer 531 can be highly purified.

A protective insulating layer 506 may be additionally formed over the insulating layer 516. For example, for the protective insulating layer 506, a silicon nitride film is formed by RF sputtering. Since the RF sputtering achieves high mass productivity, it is preferably used as the deposition method of the protective insulating layer. The protective insulating layer is formed using an inorganic insulating film which does not contain an impurity such as moisture and blocks entry of the impurity from the outside. For example, a silicon nitride film, an aluminum nitride film, or the like is used. In this embodiment, the protective insulating layer 506 is formed using a silicon nitride film (see FIG. 24E).

As the protective insulating layer 506, a silicon nitride film is formed in such a manner that the substrate 505 over which the insulating layer 516 is formed is heated at a temperature of 100 to 400° C., a sputtering gas including high-purity nitrogen from which hydrogen and moisture are removed is introduced, and a silicon semiconductor target is used. In this case also, as in the insulating layer 516, it is preferable to deposit the protective insulating layer 506 while moisture remaining in the deposition chamber is removed.

After the formation of the protective insulating layer, heat treatment may be further performed at 100 to 200° C. for 1 to 30 hours in the air. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature.

Oxygen-dope treatment (oxygen plasma-dope treatment) may be performed on the oxide semiconductor film 530 and/or the gate insulating layer 507. Oxygen-dope treatment is addition of oxygen (which includes at least one of an oxygen radical, an oxygen atom, and an oxygen ion) to a bulk. Note that the term "bulk" is used in order to clarify that oxygen is added not only to a surface of a thin film but also to the inside of the thin film. In addition, the term "oxygen-dope treatment" includes "oxygen plasma-dope treatment" by which oxygen which is made to be plasma is added to a bulk.

The oxygen plasma-dope treatment may be either a method by which oxygen which is made to be plasma by inductively coupling plasma (ICP) is added or a method by which oxygen which is made to be plasma with the use of a microwave whose frequency is 1 GHz or higher (e.g., a frequency of 2.45 GHz) is added.

The transistor described in this embodiment has high field-effect mobility; thus, high-speed operation is possible. Thus, when the transistor including an oxide semiconductor layer is used in a pixel portion in a liquid crystal display device, high-quality images can be displayed. In addition, by using transistors including oxide semiconductor layers, a driver circuit portion and a pixel portion are formed over one substrate; thus, the number of components of the liquid crystal display device can be reduced.

The off-state current of a transistor including an oxide semiconductor is low; thus, defects caused by off-state current can be reduced when a semiconductor device or the like including an oxide semiconductor is used. Thus, images can be displayed more accurately.

Embodiment 6

Next, another structure example and a driving method of a display device are described. In this embodiment, a method is described by which an image for interpolating motion of an image input from the outside of a display device (an input image) is generated inside the display device on the basis of a plurality of input images and the generated image (the generation image) and the input image are sequentially displayed. Note that when an image for interpolating motion of an input image is a generation image, motion of moving images can be made smooth, and the decrease in quality of moving images because of afterimages or the like due to hold driving can be suppressed. Here, moving image interpolation is described below. Ideally, moving images are displayed by control of the luminance of each pixel in real time; however, individual control of pixels in real time has problems such as the enormous number of control circuits, space for wirings, and the enormous amount of input image data. Thus, it is difficult to realize the individual control of pixels. Therefore, for display of moving images by a display device, a plurality of still images are sequentially displayed in a certain cycle so that display appears to be moving images. The cycle (in this embodiment, referred to as an input image signal cycle and denoted by $T_{in}$) is standardized, and for example, ⅙₀ second in NTSC and ⅕₀ second in PAL. Such a cycle does not cause a problem of moving image display in a CRT, which is an impulsive display device. However, in a hold-type display device, when moving images conforming to these standards are displayed without change, a defect in which display is blurred because of afterimages or the like due to hold driving (hold blur) occurs. Since hold blur is recognized by discrepancy between unconscious motion interpolation due to human eyes tracking and hold-type display, the hold blur can be reduced by making the input image signal cycle shorter than that in conventional standards (by making the control closer to individual control of pixels in real time). However, it is difficult to reduce the length of the input image signal cycle because the standard needs to be changed and the amount of data is increased. However, an image for interpolating motion of an input image is generated inside the display device in response to a standardized input image signal, and display is performed while the generation image interpolates the input image, so that hold blur can be reduced without a change in the standard or an increase in the amount of data. Operation such that an image signal is generated inside the display device in response to an input image signal to interpolate motion of the input image is referred to as moving image interpolation.

Figure 25A:
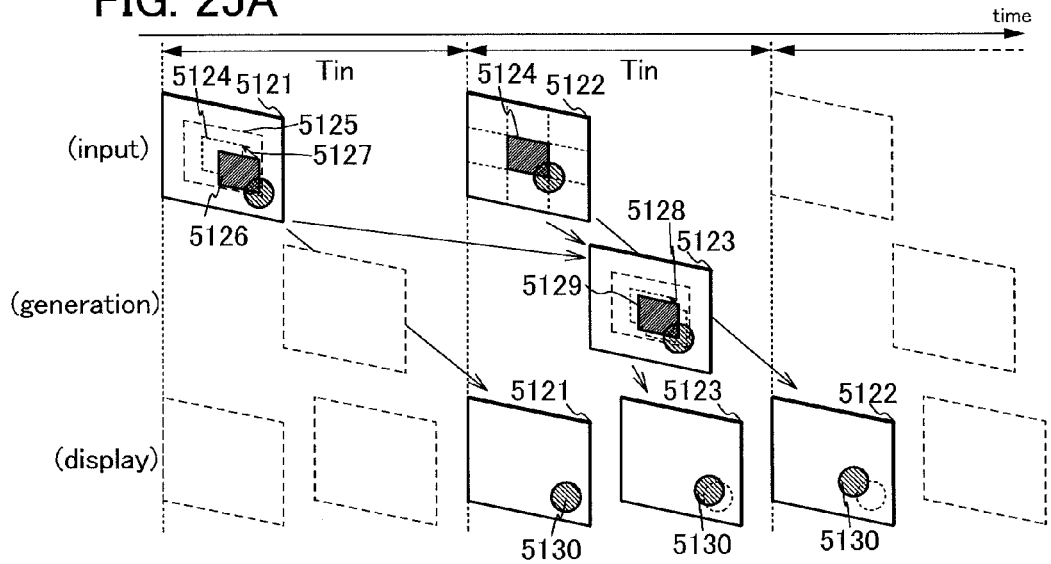
FIGS. 25A to 25C each illustrate a method for driving a semiconductor device.
Figure 25B:
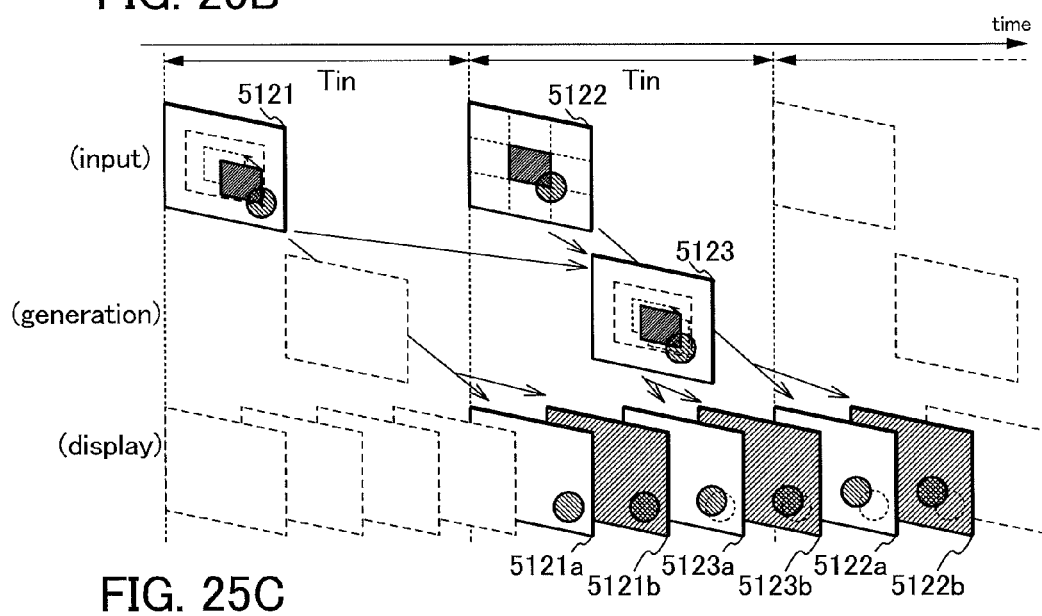

By a method for interpolating moving images in this embodiment, motion blur can be reduced. The method for interpolating moving images in this embodiment can include an image generation method and an image display method. Further, by using a different image generation method and/or a different image display method for motion with a specific pattern, motion blur can be effectively reduced. FIGS. 25A and 25B are schematic diagrams each illustrating an example of a method for interpolating moving images in this embodiment. FIGS. 25A and 25B each illustrate timing of treating each image by using the position of the horizontal direction, with the time as the horizontal axis. A portion represented as "input" indicates timing of when an input image signal is input. Here, images 5121 and 5122 are focused as two images that are temporally adjacent. An input image is input at an interval of the cycle $T_{in}$. Note that the length of one cycle $T_{in}$, is referred to as one frame or one frame period in some cases. A portion represented as "generation" indicates timing of when a new image is generated from an input image signal. Here, an image 5123 which is a generation image generated on the basis of the images 5121 and 5122 is focused. A portion represented as "display" indicates timing of when an image is displayed in the display device. Note that images other than the focused images are only represented by dashed lines, and by treating such images in a manner similar to that of the focused images, the example of the method for interpolating moving images in this embodiment can be realized.

In the example of the method for interpolating moving images in this embodiment, as illustrated in FIG. 25A, a generation image which is generated on the basis of two input images that are temporally adjacent is displayed in a period after one image is displayed until the other image is displayed, so that moving image interpolation can be performed. In this case, the display cycle of a display image is preferably half the input cycle of the input image. Note that the display cycle is not limited to this and can be a variety of display cycles. For example, in the case where the length of the display cycle is shorter than half the length of the input cycle, moving images can be displayed more smoothly. Alternatively, in the case where the length of the display cycle is longer than half the length of the input cycle, power consumption can be reduced. Note that here, an image is generated on the basis of two input images which are temporally adjacent; however, the number of input images serving as a basis is not limited to two and can be other numbers. For example, when an image is generated on the basis of three (may be more than three) input images which are temporally adjacent, a generation image with higher accuracy can be obtained as compared to the case where an image is generated on the basis of two input images. Note that the display timing of the image 5121 is the same as the input timing of the image 5122, that is, the display timing is one frame later than the input timing. However, display timing in the method for interpolating moving images in this embodiment is not limited to this and can be a variety of display timings. For example, the display timing can be delayed with respect to the input timing by more than one frame. Thus, the display timing of the image 5123 which is the generation image can be delayed, which allows enough time to generate the image 5123 and leads to reduction in power consumption and manufacturing cost. Note that when the display timing is delayed with respect to the input timing for a long time, a period for holding an input image becomes longer, and the memory capacity which is necessary for holding the input image is increased. The display timing is therefore preferably delayed with respect to the input timing by approximately one to two frames.

Here, an example of a specific generation method of the image 5123 which is generated on the basis of the images 5121 and 5122 is described. It is necessary to detect motion of an input image in order to interpolate moving images. In this embodiment, a method called a block matching method can be used in order to detect motion of an input image. Note that this embodiment is not limited to this, and a variety of methods (e.g., a method for obtaining a difference of image data or a method of using Fourier transformation) can be used. In the block matching method, first, image data for one input image (here, image data of the image 5121) is stored in a data storage means (e.g., a memory circuit such as a semiconductor memory or a RAM). Then, an image in the next frame (here, the image 5122) is divided into a plurality of regions. Note that the divided regions can have the same rectangular shapes as illustrated in FIG. 25A; however, the divided regions are not limited to these and can have a variety of shapes (e.g., the shape or size varies depending on images). After that, in each divided region, data is compared to the image data in the previous frame (here, the image data of the image 5121) that is stored in the data storage means, so that a region where the image data is similar to each other is searched. The example of FIG. 25A illustrates that the image 5121 is searched for a region where data is similar to that of a region 5124 in the image 5122, and a region 5126 is found. Note that a search range is preferably limited when the image 5121 is searched. In the example of FIG. 25A, a region 5125 which is approximately four times larger than the region 5124 is set as the search range. By making the search range larger than this, detection accuracy can be increased even in a moving image with high-speed motion. Note that search in an excessively wide range needs an enormous amount of time, which makes it difficult to realize detection of motion. Thus, the region 5125 has preferably approximately two to six times larger than the area of the region 5124. After that, a difference of the position between the searched region 5126 and the region 5124 in the image 5122 is obtained as a motion vector 5127. The motion vector 5127 represents motion of image data in the region 5124 in one frame period. Then, in order to generate an image illustrating the intermediate state of motion, an image generation vector 5128 obtained by changing the size of the motion vector without a change in the direction thereof is generated, and image data included in the region 5126 of the image 5121 is moved in accordance with the image generation vector 5128, so that image data in a region 5129 of the image 5123 is generated. By performing a series of processings on the entire region of the image 5122, the image 5123 is generated. Then, by sequentially displaying the input image 5121, the generated image 5123, and the input image 5122, moving images can be interpolated. Note that the position of an object 5130 in the image is different (i.e., the object is moved) between the images 5121 and 5122. In the generated image 5123, the object is located at the midpoint between the images 5121 and 5122. By displaying such images, motion of moving images can be made smooth, and blur of moving images due to afterimages or the like can be reduced.

Note that the size of the image generation vector 5128 can be determined in accordance with the display timing of the image 5123. In the example of FIG. 25A, the display timing of the image 5123 is the midpoint (½) between the display timings of the images 5121 and 5122; thus, the size of the image generation vector 5128 is half the size of the motion vector 5127. Alternatively, for example, when the display timing is ⅓ between the display timings of the images 5121 and 5122, the size of the image generation vector 5128 can be ⅓, and when the display timing is ⅔ between the display timings of the images 5121 and 5122, the size can be ⅔.

Note that in the case where a new image is generated by moving a plurality of regions having different motion vectors in this manner, a portion where one region has already been moved to a region that is a destination for another region or a portion to which any region is not moved is generated in some cases (i.e., overlap or blank occurs in some cases). For such portions, data can be compensated. As a method for compensating an overlap portion, a method by which overlap data is averaged; a method by which data is arranged in order of priority according to the direction of motion vectors or the like, and high-priority data is used as data in a generation image; or a method by which one of color and brightness is arranged in order of priority and the other thereof is averaged can be used, for example. As a method for compensating a blank portion, a method by which image data of the portion of the image 5121 or the image 5122 is used as data in a generation image without modification, a method by which image data of the portion of the image 5121 or the image 5122 is averaged, or the like can be used. Then, the generated image 5123 is displayed in accordance with the size of the image generation vector 5128, so that motion of moving images can be made smooth, and the decrease in quality of moving images because of afterimages or the like due to hold driving can be suppressed.

In another example of the method for interpolating moving images in this embodiment, as illustrated in FIG. 25B, when a generation image which is generated on the basis of two input images which are temporally adjacent is displayed in a period after one image is displayed until the other image is displayed, each display image is divided into a plurality of subimages to be displayed. Thus, moving images can be interpolated. This case can have advantages of displaying a dark image at regular intervals (advantages when a display method is made closer to impulsive display) in addition to advantages of a shorter image display cycle. That is, blur of moving images due to afterimages or the like can be further reduced as compared to the case where the length of the image display cycle is just made to half the length of the image input cycle. In the example of FIG. 25B, "input" and "generation" can be similar to the processings in the example of FIG. 25A; therefore, description thereof is omitted. For "display" in the example of FIG. 25B, one input image and/or one generation image can be divided into a plurality of subimages to be displayed. Specifically, as illustrated in FIG. 25B, the image 5121 is divided into subimages 5121*a* and 5121*b* and the subimages 5121*a* and 5121*b* are sequentially displayed so as to make human eyes perceive that the image 5121 is displayed; the image 5123 is divided into subimages 5123*a* and 5123*b* and the subimages 5123*a* and 5123*b* are sequentially displayed so as to make human eyes perceive that the image 5123 is displayed; and the image 5122 is divided into subimages 5122*a* and 5122*b* and the subimages 5122*a* and 5122*b* are sequentially displayed so as to make human eyes perceive that the image 5122 is displayed. That is, the display method can be made closer to impulsive display while the image perceived by human eyes is similar to that in the example of FIG. 25A, so that blur of moving images due to afterimages or the like can be further reduced. Note that the number of division of subimages is two in FIG. 25B; however, the number of division of subimages is not limited to this and can be other numbers. Note that subimages are displayed at regular intervals (½) in FIG. 25B; however, timing of displaying subimages is not limited to this and can be a variety of timings. For example, when timing of displaying dark subimages 5121b, 5122b, and 5123b is made earlier (specifically, timing at ¼ to ½), the display method can be made much closer to impulsive display, so that blur of moving images due to afterimages or the like can be further reduced. Alternatively, when the timing of displaying dark subimages is delayed (specifically, timing at ½ to ¾), the length of a period for displaying a bright image can be increased, so that display efficiency can be increased and power consumption can be reduced.

Figure 25C:
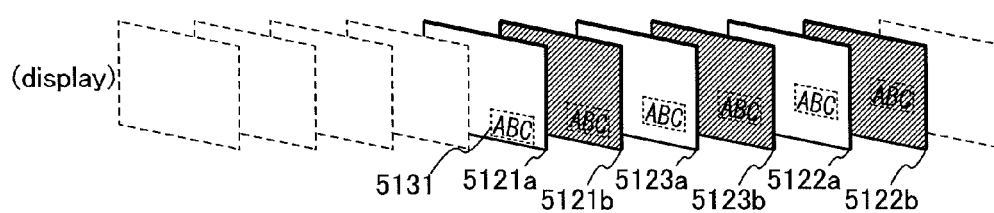

Another example of the method for interpolating moving images in this embodiment is an example in which the shape of an object which is moved in an image is detected and different processings are performed depending on the shape of the moving object. FIG. 25C illustrates display timing as in the example of FIG. 25B and the case where moving characters (also referred to as scrolling texts, subtitles, captions, or the like) are displayed. Note that since terms "input" and "generation" may be similar to those in FIG. 25B, they are not illustrated in FIG. 25C. The amount of blur of moving images by hold driving varies depending on properties of a moving object in some cases. In particular, blur is recognized remarkably when characters are moved in many cases. This is because eyes track moving characters to read the characters, so that hold blur easily occur. Further, since characters have clear outlines in many cases, blur due to hold blur is further emphasized in some cases. That is, determining whether an object which is moved in an image is a character and performing special processing when the object is the character are effective in reducing hold blur. Specifically, when edge detection, pattern detection, and/or the like are/is performed on an object which is moved in an image and the object is determined to be a character, motion compensation is performed even on subimages generated by division of one image so that an intermediate state of motion is displayed. Thus, motion can be made smooth. In the case where the object is determined not to be a character, when subimages are generated by division of one image as illustrated in FIG. 25B, the subimages can be displayed without a change in the position of the moving object. The example of FIG. 25C illustrates the case where a region 5131 determined to be characters is moved upward, and the position of the region 5131 is different between the subimages 5121a and 5121b. Similarly, the position of the region 5131 is different between the subimages 5123a and 5123b, and between the subimages 5122a and 5122b. Thus, motion of characters for which hold blur is particularly easily recognized can be made smoother than that by normal motion compensation frame rate doubling, so that blur of moving images due to afterimages or the like can be further reduced.

Embodiment 7

In this embodiment, examples of electronic devices are described. FIGS. 26A to 26H and FIGS. 27A to 27D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 26A:
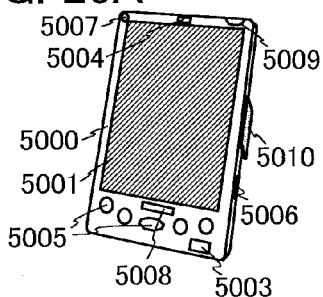
FIGS. 26A to 26H illustrate electronic devices.
Figure 26B:
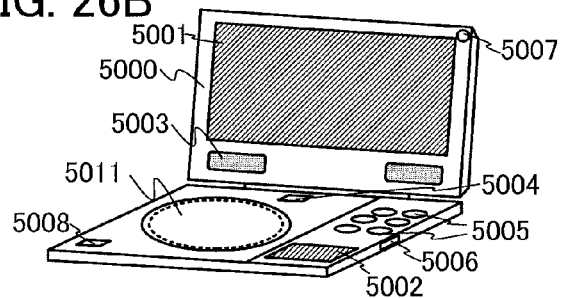
Figure 26C:
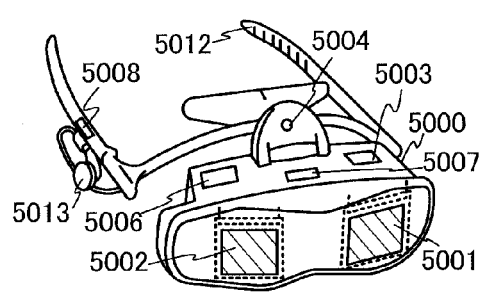
Figure 26D:
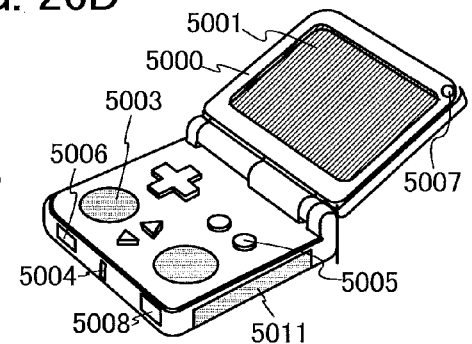
Figure 26E:
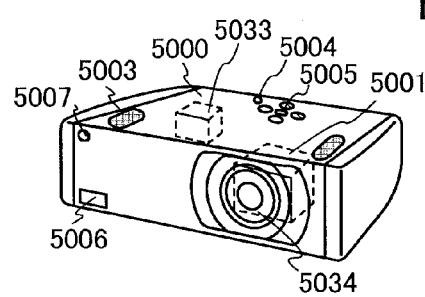
Figure 26F:
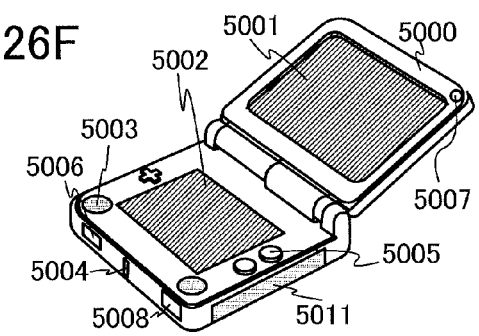
Figure 26G:
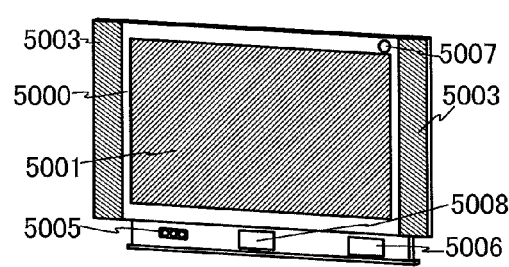
Figure 26H:
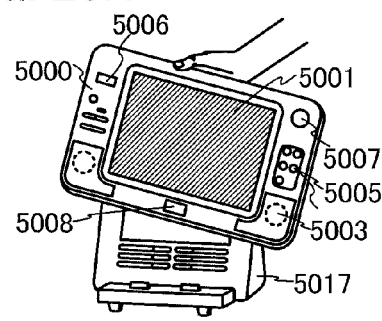
Figure 27A:
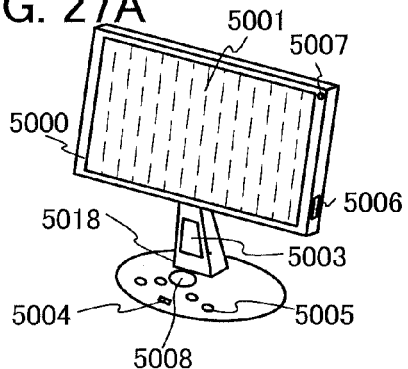
FIGS. 27A to 27H illustrate electronic devices.
Figure 27B:
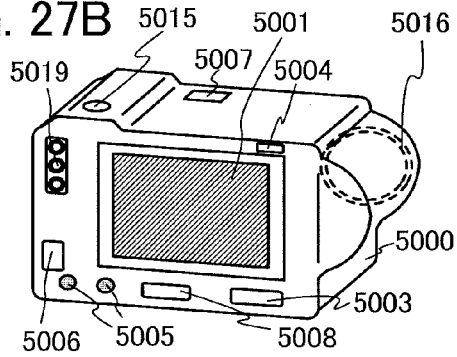
Figure 27C:
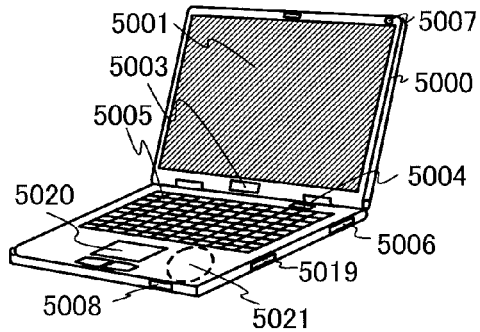
Figure 27D:
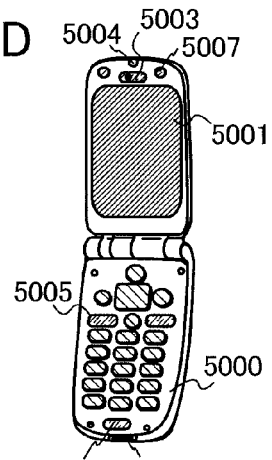

FIG. 26A illustrates a mobile computer, which can include a switch 5009, an infrared port 5010, and the like in addition to the above objects. FIG. 26B illustrates a portable image regenerating device provided with a memory medium (e.g., a DVD regenerating device), which can include a second display portion 5002, a memory medium reading portion 5011, and the like in addition to the above objects. FIG. 26C illustrates a goggle-type display, which can include the second display portion 5002, a support portion 5012, an earphone 5013, and the like in addition to the above objects. FIG. 26D illustrates a portable game machine, which can include the memory medium reading portion 5011 and the like in addition to the above objects. FIG. 26E illustrates a projector, which can include a light source 5033, a projector lens 5034, and the like in addition to the above objects. FIG. 26F illustrates a portable game machine, which can include the second display portion 5002, the memory medium reading portion 5011, and the like in addition to the above objects. FIG. 26G illustrates a television receiver, which can include a tuner, an image processing portion, and the like in addition to the above objects. FIG. 26H illustrates a portable television receiver, which can include a charger 5017 capable of transmitting and receiving signals and the like in addition to the above objects. FIG. 27A illustrates a display, which can include a support base 5018 and the like in addition to the above objects. FIG. 27B illustrates a camera, which can include an external connecting port 5019, a shutter button 5015, an image receiving portion 5016, and the like in addition to the above objects. FIG. 27C illustrates a computer, which can include a pointing device 5020, the external connecting port 5019, a reader/writer 5021, and the like in addition to the above objects. FIG. 27D illustrates a cellular phone, which can include an antenna, a tuner of one-segment (1 seg digital TV broadcasts) partial reception service for cellular phones and mobile terminals, and the like in addition to the above objects.

The electronic devices illustrated in FIGS. 26A to 26H and FIGS. 27A to 27D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 26A to 26H and FIGS. 27A to 27D are not limited these, and the electronic devices can have a variety of functions.

The electronic devices described in this embodiment each include a display portion for displaying some kind of information. When a circuit is formed using a transistor including an oxide semiconductor whose off-state current is low in such an electronic device, entry of unnecessary leakage current can be prevented. Thus, malfunctions of the circuit are reduced. Consequently, images can be displayed accurately.

A thin film transistor including an intrinsic (i-type) oxide semiconductor layer as an active layer is particularly preferable because the off-state current of the thin film transistor is low. As a method for making an oxide semiconductor layer intrinsic (i-type), dehydration or dehydrogenation is effective.

Next, application examples of semiconductor devices are described.

Figure 27E:
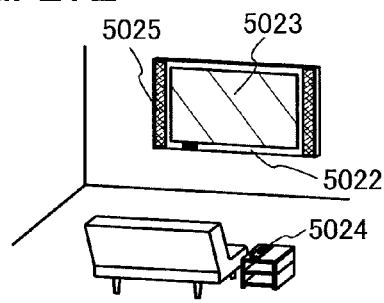

FIG. 27E illustrates an example in which a semiconductor device is incorporated in a building structure. FIG. 27E illustrates a housing 5022, a display portion 5023, a remote control 5024 that is an operation portion, a speaker 5025, and the like. The semiconductor device is incorporated in the building structure as a wall-hanging type and can be provided without requiring a large space.

Figure 27F:
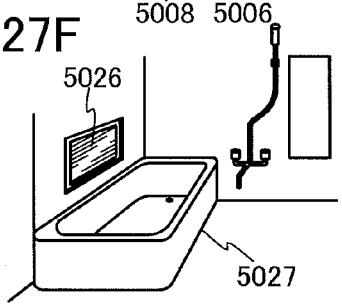

FIG. 27F illustrates another example in which a semiconductor device is incorporated in a building structure. A display panel 5026 is incorporated in a prefabricated bath unit 5027, so that a bather can view the display panel 5026.

Note that although this embodiment describes the wall and the prefabricated bath as examples of the building structures, this embodiment is not limited to these. The semiconductor devices can be provided in a variety of building structures.

Next, examples in which semiconductor devices are incorporated in moving objects are described.

Figure 27G:
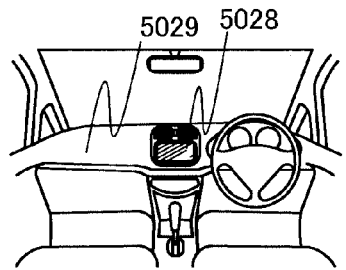

FIG. 27G illustrates an example in which a semiconductor device is incorporated in a car. A display panel 5028 is incorporated in a car body 5029 of the car and can display information on the operation of the car or information input from inside or outside of the car on demand. Note that the display panel 5028 may have a navigation function.

Figure 27H:
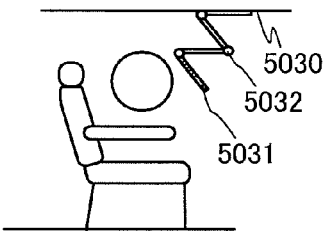

FIG. 27H illustrates an example in which a semiconductor device is incorporated in a passenger airplane. FIG. 27H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to these. The semiconductor devices can be provided for a variety of objects such as two-wheeled vehicles, four-wheeled vehicles (including cars, buses, and the like), trains (including monorails, railroads, and the like), and vessels.

The off-state current of a transistor including an oxide semiconductor is low; thus, defects caused by off-state current can be reduced when a semiconductor device or the like including an oxide semiconductor is used. Thus, images can be displayed more accurately.

A thin film transistor including an intrinsic (i-type) oxide semiconductor layer as an active layer is particularly preferable because the off-state current of the thin film transistor is low. As a method for making an oxide semiconductor layer intrinsic (i-type), dehydration or dehydrogenation is effective.

This application is based on Japanese Patent Application serial No. 2010-117300 filed with Japan Patent Office on May 21, 2010, the entire contents of which are hereby incorporated by reference.

What is claimed is:

1. A liquid crystal display device comprising:
   a pixel including a first transistor, a second transistor, a first liquid crystal element, a second liquid crystal element, a first capacitor, a second capacitor, and a third capacitor,
   wherein a first terminal of the first transistor is electrically connected to a first wiring,
   wherein a second terminal of the first transistor is electrically connected to the first liquid crystal element,
   wherein a gate of the first transistor is electrically connected to a second wiring,
   wherein a first terminal of the second transistor is electrically connected to the first wiring,
   wherein a second terminal of the second transistor is electrically connected to the second liquid crystal element,
   wherein a gate of the second transistor is electrically connected to the second wiring,
   wherein a first terminal of the first capacitor is electrically connected to the first liquid crystal element,
   wherein a second terminal of the first capacitor is electrically connected to a third wiring,
   wherein a first terminal of the second capacitor is electrically connected to the second liquid crystal element,
   wherein a second terminal of the second capacitor is electrically connected to a fourth wiring,
   wherein a first terminal of the third capacitor is electrically connected to the first liquid crystal element, and
   wherein a second terminal of the third capacitor is electrically connected to the second liquid crystal element,
   wherein the third wiring is supplied with a first pulse signal,
   wherein the fourth wiring is supplied with a second pulse signal, and
   wherein the first transistor and the second transistor include a channel region including an oxide semiconductor.

2. An electronic device comprising the liquid crystal display device according to claim 1 and an operation switch.

3. The liquid crystal display device according to claim 1,
   wherein the third wiring is supplied with a first pulse signal, and
   wherein the fourth wiring is supplied with a second pulse signal.

4. The liquid crystal display device according to claim 3, wherein the first pulse signal and the second pulse signal have opposite polarities.

5. The liquid crystal display device according to claim 1, wherein the first transistor and the second transistor include a channel region including an oxide semiconductor.

6. The liquid crystal display device according to claim 5, wherein the oxide semiconductor is an In—Ga—Zn—O-based oxide semiconductor.

7. A liquid crystal display device comprising:
   a pixel including a first transistor, a second transistor, a third transistor, a first liquid crystal element, a second liquid crystal element, a first capacitor, a second capacitor, and a third capacitor, wherein a first terminal of the first transistor is electrically connected to a first wiring, wherein a second terminal of the first transistor is electrically connected to the first liquid crystal element, wherein a gate of the first transistor is electrically connected to a second wiring, wherein a first terminal of the second transistor is electrically connected to the first wiring, wherein a second terminal of the second transistor is electrically connected to the second liquid crystal element, wherein a gate of the second transistor is electrically connected to the second wiring, wherein a first terminal of the first capacitor is electrically connected to the first liquid crystal element, wherein a second terminal of the first capacitor is electrically connected to a third wiring, wherein a first terminal of the second capacitor is electrically connected to the second liquid crystal element, wherein a second terminal of the second capacitor is electrically connected to a fourth wiring, wherein a first terminal of the third transistor is electrically connected to the second liquid crystal element, wherein a second terminal of the third transistor is electrically connected to a first terminal of the third capacitor, and wherein a second terminal of the third capacitor is electrically connected to a fifth wiring.

8. An electronic device comprising the liquid crystal display device according to claim 7 and an operation switch.

9. The liquid crystal display device according to claim 7, wherein the third wiring is supplied with a first pulse signal, and wherein the fourth wiring is supplied with a second pulse signal.

10. The liquid crystal display device according to claim 9, wherein the first pulse signal and the second pulse signal have opposite polarities.

11. The liquid crystal display device according to claim 7, wherein the first transistor and the second transistor include a channel region including an oxide semiconductor.

12. The liquid crystal display device according to claim 11, wherein the oxide semiconductor is an In—Ga—Zn—O- based oxide semiconductor.

13. A liquid crystal display device comprising:

a pixel including a first transistor, a second transistor, a third transistor, a first liquid crystal element, a second liquid crystal element, a first capacitor, a second capacitor, and a third capacitor, wherein a first terminal of the first transistor is electrically connected to a first wiring, wherein a second terminal of the first transistor is electrically connected to the first liquid crystal element, wherein a gate of the first transistor is electrically connected to a second wiring, wherein a first terminal of the second transistor is electrically connected to the first wiring, wherein a second terminal of the second transistor is electrically connected to the second liquid crystal element, wherein a gate of the second transistor is electrically connected to the second wiring, wherein a first terminal of the first capacitor is electrically connected to the first liquid crystal element, wherein a second terminal of the first capacitor is electrically connected to a third wiring, wherein a first terminal of the second capacitor is electrically connected to the second liquid crystal element, wherein a second terminal of the second capacitor is electrically connected to a fourth wiring, wherein a first terminal of the third capacitor is electrically connected to the second liquid crystal element, wherein a second terminal of the third capacitor is electrically connected to a first terminal of the third transistor, and wherein a second terminal of the third transistor is electrically connected to a fifth wiring.

14. An electronic device comprising the liquid crystal display device according to claim 13 and an operation switch.

15. The liquid crystal display device according to claim 13, wherein the third wiring is supplied with a first pulse signal, and wherein the fourth wiring is supplied with a second pulse signal.

16. The liquid crystal display device according to claim 15, wherein the first pulse signal and the second pulse signal have opposite polarities.

17. The liquid crystal display device according to claim 13, wherein the first transistor and the second transistor include a channel region including an oxide semiconductor.

18. The liquid crystal display device according to claim 17, wherein the oxide semiconductor is an In—Ga—Zn—O- based oxide semiconductor.

* * * * *